United States Patent
Ravagnan et al.

(10) Patent No.: US 12,286,702 B2
(45) Date of Patent: Apr. 29, 2025

(54) METHOD FOR THE PRODUCTION OF FUNCTIONALIZED ELASTOMERIC MANUFACTURED ARTICLES AND MANUFACTURED ARTICLES THUS OBTAINED

(71) Applicants: WISE S.R.L, Milan (IT); Maria Montorfano

(72) Inventors: Luca Ravagnan, Milan (IT); Gabriele Corbelli, Mariano Comense (IT); Cristian Ghisleri, Soncino (IT); Paolo Milani, Pavia (IT); Mattia Marelli, Cantu' (IT)

(73) Assignee: WISE S.R.L., Milan (IT)

( * ) Notice: Subject to any disclaimer, the term of this patent is extended or adjusted under 35 U.S.C. 154(b) by 1129 days.

(21) Appl. No.: 16/353,110

(22) Filed: Mar. 14, 2019

(65) Prior Publication Data

US 2019/0203341 A1 Jul. 4, 2019

Related U.S. Application Data

(63) Continuation of application No. 13/638,589, filed as application No. PCT/EP2011/054903 on Mar. 30, 2011, now Pat. No. 10,260,142.

(30) Foreign Application Priority Data

Mar. 30, 2010 (IT) .............. 2010A000532

(51) Int. Cl.
  *B32B 5/00* (2006.01)
  *B05D 5/12* (2006.01)
  (Continued)

(52) U.S. Cl.
  CPC ............ *C23C 14/221* (2013.01); *C23C 14/22* (2013.01); *C23C 30/00* (2013.01);
  (Continued)

(58) Field of Classification Search
  CPC ..... Y10T 428/24372; Y10T 428/24612; Y10T 428/24802; Y10T 428/24917;
  (Continued)

(56) References Cited

U.S. PATENT DOCUMENTS

| 7,126,686 | B2 | 10/2006 | Tsujita |
| 10,018,831 | B2 | 7/2018 | Corbelli et al. |
| 2003/0080301 | A1 | 5/2003 | Gammel et al. |
| 2004/0121528 | A1 | 6/2004 | Krulevitch et al. |

(Continued)

FOREIGN PATENT DOCUMENTS

EP 1818110 8/2007

OTHER PUBLICATIONS

International Search Report and Written Opinion for PCT/EP/EP2011/054903, mailed Jul. 5, 2011, 9 pgs.

(Continued)

*Primary Examiner* — Laura A Auer
(74) *Attorney, Agent, or Firm* — TROUTMAN PEPPER LOCKE LLP

(57) ABSTRACT

A method is described for the production of a manufactured article (20) constituted of an elastomeric polymer substrate, in selected zones of which there are deposits of particles of nanometric size of a metal or some other compound which create a region (24) of the polymeric element having desired electrical, biocompatibility and/or dielectric properties, and such that said properties are maintained even after numerous elastic deformations of the manufactured article; the invention also relates to functionalized elastomeric manufactured articles obtained by means of said method.

8 Claims, 13 Drawing Sheets

(51) Int. Cl.
 *B32B 3/00* (2006.01)
 *B32B 3/30* (2006.01)
 *C23C 14/22* (2006.01)
 *C23C 30/00* (2006.01)

(52) U.S. Cl.
 CPC ............ *Y10T 428/24372* (2015.01); *Y10T 428/2438* (2015.01); *Y10T 428/24612* (2015.01); *Y10T 428/24802* (2015.01); *Y10T 428/24917* (2015.01); *Y10T 428/265* (2015.01); *Y10T 428/31663* (2015.04); *Y10T 428/31678* (2015.04)

(58) Field of Classification Search
 CPC ......... Y10T 428/265; Y10T 428/31663; Y10T 428/31678
 See application file for complete search history.

(56) References Cited

U.S. PATENT DOCUMENTS

| | | | |
|---|---|---|---|
| 2005/0064204 A1 | 3/2005 | Lalli et al. | |
| 2006/0197953 A1 | 9/2006 | Perez et al. | |
| 2006/0258132 A1 | 11/2006 | Brown et al. | |
| 2007/0207569 A1 | 9/2007 | Greenberg et al. | |
| 2008/0038830 A1 | 2/2008 | Ure | |
| 2009/0085211 A1 | 4/2009 | Robinson | |
| 2009/0114848 A1 | 5/2009 | Iwata | |
| 2010/0159614 A1* | 6/2010 | Song .................. | G01N 33/553 428/458 |
| 2010/0226958 A1 | 9/2010 | Khoury | |

OTHER PUBLICATIONS

Ravagnan L. et al., 2009, "Fast Track Communication; Poly(methyl methacrylate)-palladium clusters nanocomposite formation by supersonic cluster beam deposition: a method for microstructured metallization of polymer surfaces," Journal of Physics O. Applied Physics, 42(8): 82002.

Wegner K et al., 2006, "Topical Review; Cluster beam deposition: a tool for nanoscale science and technology," Journal of Physics O. Applied Physics, 39(22):R439-R459.

A. Podesta et al., Micro-and Nanoscale Modification of Poly(2-hydroxethyl methacrylate) Hydrogels by AFM Lithography and Nanoparticle Incorporation, Journal of Nanoscience and Nanotechnology. vol. 5 425-430 2005 American Scientific Publishers.

D. S. Gray et al., High-Conductivity Elastomeric Electronics, Advanced Materials, 2004, 16, 393-397,No. 5, Mar. 5, Wiley-VCH Verlag Gmbh & Co., KGaA, Weinheim.

S. Rosset et al., Metal Ion Implantation for the Fabrication of Stretchable Electrodes on Elastomers, Advanced Functional Materials, 2009, 19,470-478, Wiley-VCH Verlag GmBH & Co. KGaA Weinheim.

National Programme on Technology Enhanced Learning (NPTEL), a project funded by MHRD, Government of India, Engineering Materials and Processing Techniques: Introduction, Lecture 4.1 on Thermoplastics and Thermosets, accessible at n ptel<dot>ac<dot>in <l>courses<l> 112107085<l> module4<l> lecture 1 <l> lecture 1 <dot>pdf.

An Introduction to Plastics, accessible at secure-web<dot>cisco<dot>com<l>1peiyCCGHqnXOOOxm2wBQoyA6bTy3ddJvynesn1m9kYEXJ9wZrZ74Tvj-SyYdrCy4ldpeAfCQEq7rgf2FZ_ACmU5yZ6Lp2IG7H7li9GeHOFraDS1i5N5H4ubYptF2c9rGcvDeYPQuqHPT6Lt2fT20t8XCGZhXZLaZb6ls59s19ZXWaXxqLs8c6QN8bamRAAK21SxuF2IBuXxlBLS5JSGWRglhttp%3A%2F%2Fplastiquarian.com%2Fwpcontent%2Fuploads%2F2015%2F06%2Fplasticbook.pdf.

Johston I.D. et al., 2014, "Mechanical characterization of bulk Sylgard 184 for microfluidics and microengineering," 1. Micromech. Microeng. 24:035017.

Chiu et al., "Fracture of Metalpolymer Line Structers. I. Semiflexible Polyimide," Journel of Applied Physics 76:5136-5142 (1994).

* cited by examiner

A)

B)

METHOD FOR THE PRODUCTION OF FUNCTIONALIZED ELASTOMERIC MANUFACTURED ARTICLES AND MANUFACTURED ARTICLES THUS OBTAINED

CROSS REFERENCE TO RELATED APPLICATIONS

This application is a continuation of U.S. application Ser. No. 13/638,589, filed on Sep. 28, 2012, which is U.S. National Stage entry of International Patent Application No. PCT/EP2011/054903, filed Mar. 30, 2011, which in turn claims priority to Italian Patent Application No. MI2010A000532, filed on 30 Mar. 2010, each of which is hereby incorporated by reference in its entirety.

FIELD OF THE INVENTION

The present invention relates to a method for the production of manufactured articles constituted of an elastomeric polymer substrate, in selected zones of which there are particles of nanometric size of a metal or of some other compound that create a region of the polymeric element having desired electrical, biocompatibility and/or dielectric properties, and such that said properties are maintained even after numerous elastic deformations of the manufactured article; the invention also relates to functionalized elastomeric manufactured articles obtained by means of said method.

PRIOR ART

There are numerous manufactured articles constituted of a combination of materials with given functionalities, typically electrical, magnetic or optical, with polymer materials that function as a mechanical support for the functional material. The materials endowed with the aforesaid functionalities are typically metals (which endow the manufactured article mainly with characteristics of electrical conduction), oxides or other compounds of metals (characteristics of electrical insulation). The combination of these materials and the polymers is of enormous industrial importance because it makes it possible to obtain manufactured articles which, as well as having said functional properties, have characteristics that are typical of polymers, for example characteristics of electrical insulation, resistance to atmospheric agents and to water, low weight, ductility, plasticity (deformability, elasticity) and, last but not least, low cost. The polymers can moreover easily be processed during their synthesis or subsequently to give them practically any desired shape (for example by molding).

Deposits of metals or oxides on the surface of a polymer, or inside the matrix of the latter, can be obtained by many various techniques, such as evaporation, chemical deposition of vapours of a precursor of a metal (better known as "Chemical Vapour Deposition" or CVD) followed by reduction to metal and/or oxidation to the corresponding oxide, physical deposition of vapours (better known as "Physical Vapour Deposition", PVD or sputtering), laser ablation and the like; these techniques, widely known in this sector, generally give rise to continuous deposits of the functional material.

Other techniques, usable in principle for forming metallic deposits on polymer surfaces or underneath them, are those that envisage the acceleration to high kinetic energies of atoms or ionized nanoparticles, by means of potential differences that range from thousands to millions of volts (for example by means of ion guns), with consequent implantation in the matrix of the polymer. However, these techniques, defined as ion implantation (or derived techniques) are not suitable for the purposes of the present invention, because they require the implanted atoms or particles to be electrostatically charged; firstly, this causes a build-up of charge within the polymer substrates (which normally, being insulators, cannot dissipate said charge), which greatly limits the quantity of atoms or particles implantable and/or the velocity of deposition thereof, and secondly, damage of the polymer, for example its carbonization (especially on the surface), which can greatly compromise the characteristics of biocompatibility of the final product. The term "biocompatible" means polymers and other materials compatible with living organisms, tissues and organs, in that they are non-toxic, are not harmful and do not cause immunological reactions in these organisms, tissues and organs.

Other techniques, usable in principle for forming metallic deposits on polymer surfaces or underneath them, are those that envisage the immersion or formation of metal nanoparticles into a polymer matrix by chemical processes, such as the reduction of metal salts dispersed in a not-yet-cross-linked polymeric matrix using a reducing agent. In these cases, the use of chemical agents is, in general, a necessary step for the synthesis of metal-polymer systems. However, the combination of chemical agents with some polymers can have many drawbacks on the physical and chemical properties of said polymers. First of all, as known by those skilled in the art, many elastomeric polymers show intolerance to organic solvents. For example, this intolerance can lead to the swelling of the elastomeric matrix which compromises the dimensional stability of the polymer (the swelling of the elastomer can cause deformation of its topographic features). This is a critical aspect when such techniques are used for the production of metal-polymer systems with micropatterned features. Then, the use of chemical agents can greatly compromise the characteristics of biocompatibility of the final product. In these sense, such chemical processes are not suitable for the purposes of the present invention.

Manufactured articles, and methods for their production, are also known in which the functional material is present on the surface or inside the polymer in the form of particles, generally of nanometric dimensions, which form a discontinuous deposit. U.S. Pat. No. 6,592,945 B2 describes a method in which nanometric particles of a material of interest are first deposited, by techniques such as sputtering or CVD, on the surface of a polymer in an intermediate state of crosslinking, and are then made to diffuse in the polymer during the thermal treatment that leads to complete crosslinking of said polymer. This method comprises the formation of a thin coating of nanoparticles (or agglomerates) on the thermoplastic substrate, with low or even absent implantation of the said nanoparticles (or agglomerates) inside the polymer matrix, leading to low adhesion between metal and polymer.

The article "Micro- and nanoscale modification of poly (2-hydroxyethyl methacrylate) hydrogels by AFM lithography and nanoparticle incorporation", A. Podesta et al., Journal of Nanoscience and Nanotechnology, 5(3), 425-430, 2005, describes the production of a "bed" of carbon nanoparticles on the inside surface of a mould, into which the precursors of the polymer under investigation are then poured; the carbon particles are incorporated in the surface layers of the polymer as it forms. U.S. Pat. No. 4,626,561 describes the use of a beam of particles for their implantation in molten polymer (to obtain a homogeneous distribution thereof in the final polymer, principally to endow it with mechanical properties). Finally, the article "Poly(methyl methacrylate)-palladium clusters nanocomposite formation by supersonic cluster beam deposition: a method for microstructured metallization of polymer surfaces", L. Ravagnan et al., Journal of Physics D: Applied Physics, 42(8), 082002/1-082002/5, 2009, describes the application of a similar technique for obtaining deposits of palladium nanoparticles in a rigid polymer. The polymer used in this paper is poly(methyl methacrylate), a rigid thermoplastic polymer with Young's modulus of about 1800-3100 MPa. With rigid polymer materials, it is possible to produce flexible manufactured articles, namely, articles that can be bent to some extent without breaking, in particular by using very thin polymer slabs. Objects produced with rigid polymers can also be stretched, in some cases even up to 150%; these objects, however, do not recover their original dimensions once the applied strain force is released, and their deformation upon stretching is permanent. On the other hand, rigid polymers cannot be used to produce devices exhibiting reversible extension or stretching. In general, reversibly extensible (or stretchable) manufactured articles can only be produced using as polymeric base an elastomeric polymer. Elastomeric polymers (also referred to as elastomers) are characterized by Young's modulus values comprised between about 0.01 and 200 MPa. In the rest of the description and in the claims, when the terms "elastomeric polymer" or "elastomer" are used, it will be meant a material having the aforesaid mechanical characteristics or, following the definition given by the Encyclopaedia Britannica, "any rubbery material composed of long chainlike molecules, or polymers, that are capable of recovering their original shape after being stretched to great extents"; in particular, by "elastomer" or "elastomeric" in the present description and claims will be intended a material that can undergo an indefinite number (more than one) of cycles of elongation/relaxation, in which the elongation is of at least 25% compared to the length of the polymer body at rest. Similarly, in the following description and claims, when the terms "extension" or "stretching" (and derived terms) are used, these will refer to elastic extension or stretching and will imply a reversible deformation, such that once the strain is no longer applied, the device returns to its original shape and dimensions, and such that cycles of deformation and subsequent relaxation can be repeated many times.

In general, as is known by those skilled in the art, if the processes normally used for the metallization of rigid polymers are used for the metallization of elastomeric polymers, the resulting devices show mechanical properties that make them unsuitable for the intended applications; in particular, stretchability of the device with maintenance of the electrical properties, and adhesion between the metal and the polymeric parts, are poor. This is mainly due to the difference between the mechanical properties of metal deposits and the polymer used: for rigid polymers this difference is low enough to permit a good matching of the mechanical properties between the functional metal and the polymer used as substrate, allowing the bending of the final device; conversely, for elastomeric polymers, this matching between the mechanical properties of the functional metal and the ones of the polymeric substrate is not good enough to allow the extension/stretching of the final device even for relatively low values of strain. Elastomeric devices produced with a traditional metallization process, such as evaporation, can achieve only few percent of strain during loading and unloading cycle without electric breakage, as reported for example in the articles "Metal Ion Implantation for the fabrication of stretchable electrodes on elastomers" by S. Rosset et al., Adv. Funct. Mater. 2009, 19, 470, and "High-Conductivity Elastomeric Electronics", D. S. Gray et al., Advanced Materials, Vol. 16, No. 5, pp. 393-397, 2004. As a confirmation of the existence of the problem, it has been proposed to deposit metal layers over corrugated polymer surfaces, as discussed in detail below.

For some applications it is necessary for the manufactured article also to be flexible, and to maintain the desired functional properties after bending; the production of manufactured articles containing, for example, electrically conducting lines inside flexible polymeric matrices is described in U.S. Pat. No. 6,878,643 B2 and in international patent applications WO 00/20656 A1, WO 2005/114720 A2, WO 2009/003182 A1 and WO 2009/107069 A2. Manufactured articles of this type can find application in numerous fields, such as in the automation of moving parts and in particular in robotics.

Another extremely important sector in which functional manufactured articles or devices, in particular with electrical functionalities, can be applied is that of devices for implanting on or in a living organism, in particular on or in the human body. Numerous devices of this type, both active and passive, are under development. Active devices (also called "actuators") are those that can cause an action in the human body, such as reaction to an electrical stimulus provided by the device; this category includes, for example, implantable neural interfaces (described for example in WO 2009/090398 A2), devices for deep brain stimulation (described for example in WO 2008/035344 A2), devices for electrical stimulation of the spine for curing paralysis, or "actuators" in general, capable for example of stimulating or replacing muscular movement (so-called "artificial muscles"). Instead, passive devices comprise all the sensors that can be implanted temporarily or permanently in the body for recording conditions or states of parts or organs thereof, for example temperature sensors, sensors of the stress to which a bone or a joint is subjected, or vascular sensors (such as the cardiovascular sensors described in US 2008/0302675 A1), all these sensors can also incorporate electronic components for data processing and optionally transmission to the outside, also in wireless mode, such as those described in WO 2008/140243 A2.

Devices for implanting in the body must of course be made of biocompatible materials, which is also a necessary condition for the products used during production that can leave traces in said devices. Moreover, the processes used must not alter the properties of the biocompatible materials used as substrate.

In recent years research has focused on the production of manufactured articles constituted of the combination of a polymer and a functional material, which as well as being flexible are also stretchable (i.e. can be elongated in one or more directions) while maintaining the functional property; this characteristic is of particular interest in devices for implanting in the human body, because it makes it possible for the range of types of actuators and sensors to be increased considerably, by allowing these devices to be inserted also in parts of the body that are subject to elongation or compression. A device produced with a stretchable material also causes less irritation and pain when implanted in the body, having elastic properties that are similar to those of the parts of the body surrounding it. While the production of flexible manufactured articles with functional properties is relatively simple, the production of stretchable manufactured articles, whose functionality remains unchanged after several cycles of deformation, has proved much more complex, because the functional materials used are intrinsically inelastic in tension. As discussed for example in the article of D. S. Gray et al. cited above, a gold trace deposited on an elastomeric polymer can withstand elongation of up to 2.4%, beyond which the metal deposit is fractured and the trace loses its characteristics of electrical conduction.

Various ways of overcoming this limitation have been proposed in the literature.

The article by S. Rosset et al. cited above describes the production by ion implantation of stretchable devices comprising metal deposits in an elastomeric body. Though in the article the feasibility of stretchable electrodes by ion implantation is demonstrated, the technique suffers from some drawbacks. In first place, as admitted in the section "Dielectric Breakdown Field" of the article, the dissipation of the high energies carried by implanted ions may easily lead to carbonization of the elastomeric surface where implantation takes place: this process may lead to several adverse effects, such as reduced local elastic properties or reduced biocompatibility. Another main problem of this technique is that the implanted atoms have a great mobility in the structure of the elastomer, and heavily aggregate forming particles of greater dimensions already during implantation (the driving force of this spontaneous phenomenon being the reduction of free surface energy of the system). Particles closer to the surface of the elastomer body, during their growth, tend to capture more incoming atoms and "shield" the lower parts of the same body, eventually completely blocking the penetration of further atoms in the elastomer, resulting in a strongly inhomogeneous distribution of dimensions of the final nanoparticles along the depth of the deposit; in particular, said dimensions are greater (much higher than the dimensions of the original atoms) for nanoparticles at (or close to) the surface of the elastomeric body, and constantly decrease at increasing depths inside said body; this situation is well represented in FIG. 1 of the article. Furthermore, the average size of the nanoparticles in the elastomeric body is determined by the amount of implanted ions, and cannot be controlled independently. This strongly inhomogeneous distribution of particle dimensions is likely responsible of the observed behaviour of these deposits (see FIG. 6 in the same article), which can resist high strains only if they have relatively high resistivity at rest (implying low amount of implanted atoms—and thus smaller nanoparticles in particular at the surface of the elastomeric body), while the reduction of resistivity at rest can be obtained only with a correspondent lose of resistance to strain.

Another approach proposed is to produce conductive traces that are not linear, for example conductive lines of helical, undulating or zigzag shape.

The article of Gray et al. cited above describes the production of conductive lines of gold in a silicone matrix, in which the conductive lines are of helical shape and can withstand elongation of the matrix up to approx. 27%. Patent application EP 1,790,380 A1 describes a process for production of current-conducting manufactured articles in which a trace of the desired shape is obtained from a metal sheet (e.g. Pd or NiTi) by laser cutting or by chemical attack, which is then made to adhere using thermal treatments to an elastomeric substrate; the trace is of zigzag shape with rounded corners, to reduce the risk of breakage during cycles of deformation. U.S. Pat. No. 7,085,605 B2 describes a method of production of conductive elastomeric manufactured articles in which undulating metal traces are deposited, for example by electrochemical deposition. Finally, patents U.S. Pat. No. 7,265,298 B2 and U.S. Pat. No. 7,337,012 B2 and international patent application WO 2004/095536 A2 describe the production of conductive elastomeric manufactured articles comprising either a single trace or a plurality of traces for each conductive line, in which the traces are produced by photolithographic techniques with undulating geometry in the plane of the trace, or with a non-planar trace, deposited on a corrugated surface of the substrate polymer. However, these methods are not entirely satisfactory. In the first place, they are fairly laborious and therefore unsuitable for transfer to production on an industrial scale, in particular as regards that of the article of Gray et al., which requires the production of a helical conductive line, or those of U.S. Pat. No. 7,265,298 B2 and U.S. Pat. No. 7,337,012 B2 in the case of deposition of conductive traces on non-planar (corrugated) surfaces. Secondly, the manufactured articles obtained using these methods are resistant to tension only in the mean direction of the trace (i.e. in the median direction of the undulation or corrugation).

A further approach, described for example in international patent application WO 2009/114689 A1, is to deposit (using known methods) metal traces on a pretensioned elastomer; after deposition, the elastomer is allowed to return to its dimension "at rest" and the metal deposit rearranges geometrically to follow the contraction. In this case, however, in the elastomer at rest the metal deposit becomes compressed; this can result firstly in a change in the mechanical properties of the surface of the elastomer on which the metal deposit is formed, which can induce fracturing of the latter in the course of repeated cycles of elongation and relaxation to which the manufactured article will be subjected. Besides, the manufactured articles obtained by these methods are also only resistant to tension in the direction in which the elastomer had been pretensioned initially, and for a maximum extension equal to said pretension. This approach also creates notable problems of scalability of the process.

Still another approach is the one proposed by patent application US 2010/0002402 A1, which describes the production of flexible conductive manufactured articles constituted of a layer comprising the conductive traces incorporated in an elastomer matrix by the interposition of intermediate layers, which have the function of absorbing most of the elongation of the matrix, transferring it only minimally to the layer with the conductive trace. This method requires a particularly complex procedure for production of the manufactured articles. In addition, this method shifts the problem but does not solve it; in fact, since in these manufactured articles the length of the conductive trace remains almost unchanged in the cycles of elongation/relaxation, it is necessary to provide some other way of bringing electrical contacts of variable length from the outside to the trace, in order to compensate the deformations of the manufactured article.

Another limitation of most known methods adopted for forming metallic deposits (by various techniques) on the surface of a polymer is that generally it is necessary to pretreat this surface to permit adhesion of the deposit and avoid its delamination. These treatments can be of a physical type (for example thermal, treatments with plasma, irradiation with particles or UV light) or of a chemical type (in particular, deposition of an intermediate layer of chromium with the function of a compatibilizing agent between the polymer and the metal selected for the deposit); however, all these treatments, as well as adding complications to the process, can render the manufactured article non-biocompatible (in particular in the case when chromium is present).

SUMMARY OF THE INVENTION

The purpose of the present invention is to provide a method for the production of elastomeric manufactured articles that are functionalized electrically, optically, magnetically, chemically and/or with respect to the characteristics of interaction with biological systems, which overcomes the problems of the prior art, as well as provide manufactured articles obtained using said method.

These aims are achieved according to the present invention which, in a first aspect, consists of a method for the production of a functionalized elastomeric manufactured article comprising a deposit of at least one functional material selected from a metal, an oxide or some other compound of a metal, which comprises the operation of forming said deposit for implanting neutral clusters of nanometric dimensions of said material in an elastomeric material.

The inventors found that implanting aggregates of nanometric dimensions of the aforementioned functional materials in an elastomer leads to the formation of a composite material in a well-defined region within the elastomer. This composite material consists of a metal/polymer nanocomposite, i.e. it is formed from nanoparticles of the aforementioned functional materials embedded in the matrix of the polymer.

The inventors have verified that these materials maintain the desired functionality even after a large number of intense elastic deformations, in particular elongations of at least 50% of the dimensions of the elastomer at rest.

The inventors have further verified that the obtained materials have properties of biocompatibility or bioinertness, if biocompatible polymer and functional materials are used as precursors, and that in some cases they give rise to improved properties of bioactivity compared to the elastomer of the substrate.

BRIEF DESCRIPTION OF THE DRAWINGS

The invention will be illustrated in detail below, with reference to the Figures, in which.

DETAILED DESCRIPTION OF THE INVENTION

The aggregates of nanometric dimensions are commonly known in this sector by the term "nanoclusters", which will be used in the rest of the text. The nanoclusters can be produced by various techniques. The sources of nanoclusters most commonly used can be divided into two classes, those in which the nanoclusters leave the source, diffusing freely after their formation, and those in which the nanoclusters are driven out of the source by the expansion of a gas (generally inert, called "carrier gas") to form an inseminated gas beam of nanoclusters. This second class of sources, called "sources with inseminated beam of nanoclusters", is preferred for the present invention. When in this second case expansion of the mixture of gas and nanoclusters takes place in supersonic conditions, as known by a person skilled in the art, the terms "supersonic inseminated beam of nanoclusters" and "sources with supersonic inseminated beam of nanoclusters" are used. The technique that uses said sources, both with a non-supersonic beam and in the supersonic case, for depositing the nanoclusters onto a substrate, is called deposition of clusters by an inseminated beam, better known by the term "Cluster Beam Deposition" or its abbreviation CBD, which will be used in the following.

There are many variants of the source of nanoclusters, which often differ from one another only in design details or in the processes used for vaporizing the functional materials used for synthesis of the nanoclusters (such as, for example, the sputtering process, laser evaporation or electron beam evaporation). In the following, one possible type of source is described, purely as an example, but the invention can also be carried out with any other known source capable of generating nanoclusters.

Figure 1:
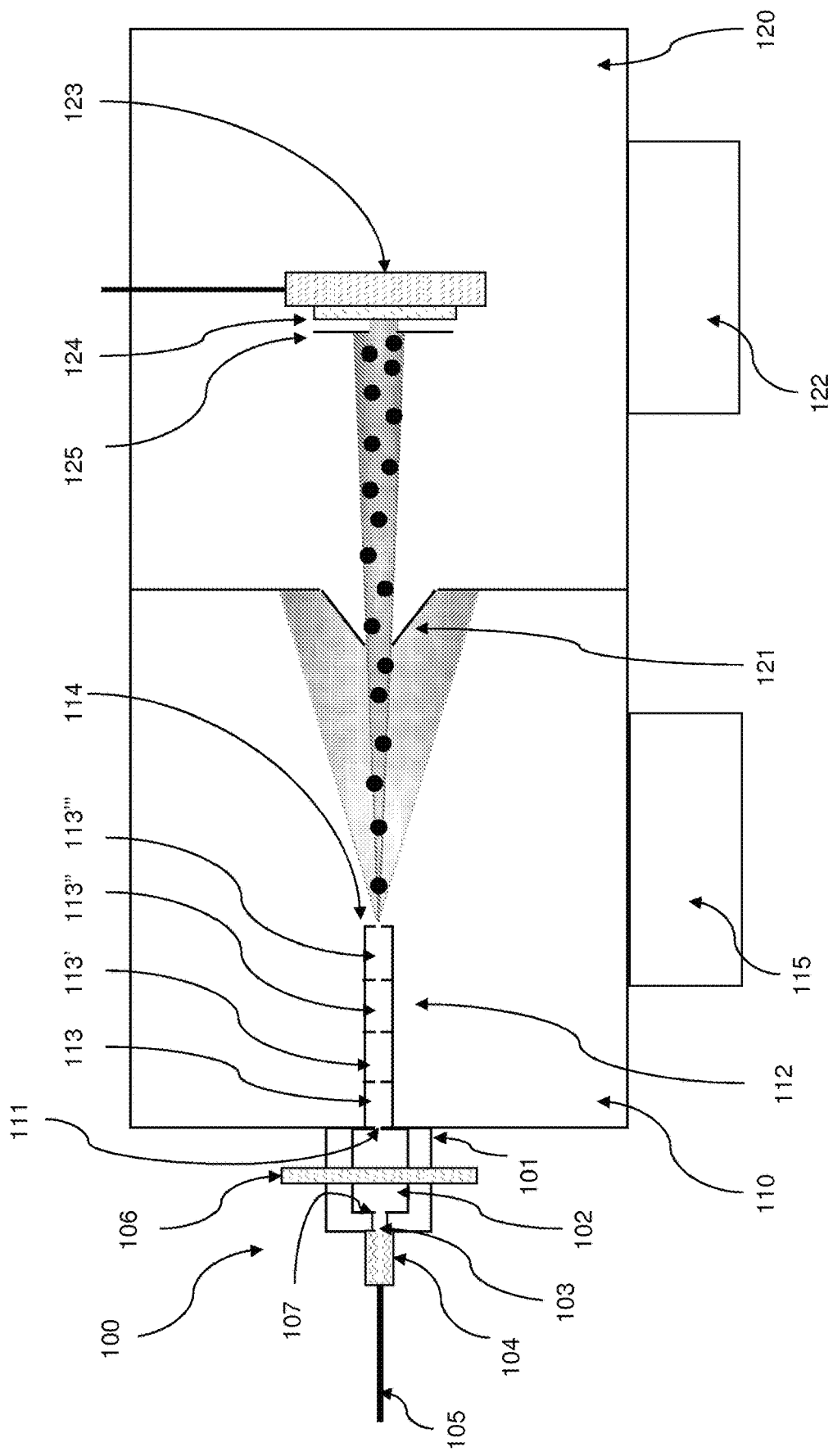
FIG. 1 shows, schematically, a possible system for production and implantation of nanoclusters for carrying out the method of the invention.

FIG. 1 shows a possible system for the production of nanocomposite deposits. The source of nanoclusters, 100, is composed of a hollow ceramic body 101 inside which there is a cylindrical cavity 102 (called "cavity of the source"), generally having a volume of a few cubic centimetres. At one end of the cavity of the source there is the outlet nozzle 103 (for example with a diameter of 100 μm) of a solenoid valve 104 which controls the entry of the carrier gas into said cavity. A line for high-pressure technical gases 105, preferably of high purity (equal to at least 99.9999%), is connected to the valve. Inside the cavity of the source, orthogonal to the axis of the latter, there is a cylindrical rod 106 (generally a few millimetres in diameter) which constitutes its cathode, made of the material from which the nanoclusters are to be formed. During operation of the source, the rod is preferably kept rotating about its axis of symmetry, at a speed of some revolutions per minute (rpm); this condition helps to stabilize the operation of said source. For its part, the anode of the source is constituted of a perforated metal disk 107 (for example of copper) connected to the ground and located near the outlet nozzle of the valve (positioned so as not to obstruct said nozzle). The opposite end of the cavity of the source (called "exit end of the cavity") is connected to a vacuum chamber called "expansion chamber", 110, via an orifice 111 (called "nozzle" in the industry) and a collimator 112 with aerodynamic lenses. The nozzle is a metal disk (e.g. steel) a few centimetres in diameter with a hole approx. 2 mm in diameter in the centre. The nozzle closes the exit end of the cylindrical cavity of the source, in such a way that said cavity is connected to the collimator with aerodynamic lenses via the hole in the nozzle. The collimator with aerodynamic lenses can be made up of four successive stages (113, 113', 113", 113'''), each of which is in its turn made up of a hollow metal cylinder with an inside diameter of about 10 mm and a height typically of a few centimetres. The stages are interconnected with one other by aerodynamic lenses constituted of steel disks with a diameter equal to that of the hollow cylinders and with a hole at the centre with a diameter of approx. 2 mm. The last stage is in its turn connected to the expansion chamber by another aerodynamic lens 114 with a hole with a diameter of approx. 1 mm.

The expansion chamber is kept under vacuum by a pumping system 115 (for example, a typical system adopted for these sources is constituted of a series of pumps in "cascade", a rotary or a two-stage "Roots" pump and a turbomolecular pump), capable of bringing the pressure in the chamber, prior to commencement of implantation, to values between approx. $1 \times 10^{-5}$ and $1.5 \times 10^{-4}$ pascal (Pa). Before the implantation process begins, the pressure is roughly uniform in the whole system, because the cavity of the source is evacuated, via the holes of the nozzle and of the collimator, by the pumping system of the expansion chamber; conversely, during the implantation process, the inflow of gas from the solenoid valve increases the pressure in the cavity of the source, which is controlled to an equilibrium value due to the flow of entering gas and the rate of pumping by the system of pumps. The cylindrical cavity of the source, the hole in the nozzle and the holes in all the aerodynamic lenses are aligned on the same axis of symmetry (called "beam axis"); to be able to flow from the cavity of the source to the expansion chamber, a gas must necessarily pass successively through both the hole in the nozzle and the holes in all the aerodynamic lenses.

The source has a pulsed regime, with a frequency of the cycles of operation of the source typically equal to several hertz. In each cycle the solenoid valve is opened for a period of time (called "valve opening time") typically of the order of hundreds of microseconds (μs). In each cycle, after a time between 0.3 and 1.0 milliseconds (ms) from valve opening, called "delay time", a voltage of approx. 850 V (called "discharge voltage") is applied between the anode and the cathode of the source for a period of time (called "discharge time") between 60 μs and 100 μs. The valve opening time, the delay time, the discharge voltage and the discharge time are the process control parameters; these parameters are defined by the operator before and during the time that the source is operational, in order to stabilize its operation and optimize the quantity of nanoclusters produced per second (this quantity is called "deposition rate" of the source); these parameters, and in particular the valve opening time, cannot be selected completely a priori, and must necessarily be regulated during operation of the source.

Since the nanoclusters continue to grow in size by aggregation up to the moment of their exit through the nozzle or the collimator, it is possible to control the size of the nanoclusters before implantation by controlling the time that elapses between formation of the vapours in the cavity of the source and exit through the nozzle or the collimator to form the beam. This time, in its turn, can be controlled both by regulating the geometric characteristics of the source (for example the volume of the cavity of the source, the diameter of the hole in the nozzle, the number of stages of the collimator, the size of said stages, and the diameter of the holes in the aerodynamic lenses) and by varying the operating parameters of the source. The latter have an influence on the residence time of the mixture in the cavity of the source as they determine the pressure and temperature of the carrier gas in the cavity (controllable by varying the valve opening time, valve inlet pressure, discharge voltage and discharge time). Moreover, the nature of the carrier gas (i.e. the gas or mixture of gases used) and the pressure difference between the cavity and the expansion chamber (controllable by acting on the pumping system of the expansion chamber) also have an influence on said residence time. All the aforementioned parameters finally also determine the velocity of the nanoclusters in the beam.

Application of the discharge voltage between cathode and anode causes an electric discharge between the end of the rod inside the source and the anode. This discharge ionizes the argon atoms which, propelled towards the cathode by the applied potential, form a plasma plume that erodes the metal by "ion sputtering". The atoms of the cathode material are thus vaporized and, establishing thermal equilibrium with the argon, aggregate together, forming the nanoclusters. The mixture formed from argon and nanoclusters, typically at a pressure of some hundreds of hectopascals (hPa), can then exit, through the nozzle and the collimator with aerodynamic lenses, from the source chamber to the expansion chamber. The high pressure gradient between the source chamber and the expansion chamber, in addition to propelling said mixture through the nozzle and the collimator to the expansion chamber, causes its rapid adiabatic expansion that leads to the formation of a supersonic beam. Moreover, as is known by a person skilled in the art, the geometric configuration of the collimator with aerodynamic lenses induces fluid-dynamic effects capable of concentrating the nanoclusters on the beam axis. Thanks to this, the nanocluster beam has divergence of the order of 1° and the mean velocity of the nanoclusters in the beam is approx. 1000 m/s (these two parameters can be modulated in relation to the operating parameters of the source).

The expansion chamber communicates with a third chamber 120 (called "deposition chamber") by means of a hollow cone 121 (called "skimmer") with a 3-mm hole at the vertex. The axis of this hole is aligned with the beam axis, so as to permit passage of the central portion of the nanocluster beam and disperse the uncollimated portion of the beam of argon and nanoclusters. The deposition chamber is connected to a second pumping system, 122, similar to the one described previously, which maintains an average pressure of approx. $5 \times 10^{-3}$ Pa inside the chamber during operation of the source.

A sample holder 123 is placed in the deposition chamber, turned towards the nanocluster beam in order to intercept it; the elastomer 124, in which the nanoclusters are to be implanted, is positioned on said sample holder prior to evacuation of the deposition chamber. In some configurations the axis of the nanocluster beam may not be orthogonal to the elastomer surface exposed to the beam. The nanoclusters can be deposited on just a portion of the polymer surface, delimiting it with "masks", as described below; the figure shows this preferred embodiment: element 125 is the mask. The sample holder can moreover be connected to a remote-controlled motorized system, which is able to move said sample holder (and the mask if present) in two directions orthogonal to the axis of the cluster beam. This movement, called "rastering", makes it possible to expose an arbitrarily large area of the polymer film to the nanocluster beam even though the projection of the nanocluster beam on the sample holder has a diameter of approx. 3 cm. Finally, the sample holder is equipped with a quartz microbalance (known by a person skilled in the art by the abbreviation QCM, not shown in the figure) which, before commencement of the process of implantation of the nanoclusters in the polymer film, is exposed to the nanocluster beam always by the motorized drive system of the sample holder. It is thus possible to measure the rate of deposition of the source and optimize its operating parameters.

After optimization, the process of exposure of the polymer to the nanocluster beam begins. During this process the nanoclusters are implanted in the polymer and form a nanocomposite layer therein. Before and during exposure, the polymer film is maintained at room temperature (equal to approx. 20° C.). The exposure time depends on the area covered by the rastering and on the desired nanocluster density in the nanocomposite, and generally varies between some tens of minutes and some hours. Moreover, a "blank" is generally positioned on the sample holder, near the elastomer and in an area covered by the rastering process, said blank comprising for example a silicon substrate of some square millimetres exposed to the beam with its polished face, and partially masked by aluminium foil. The uncovered part of said substrate is thus subject to deposition of the nanoclusters in the same way as the polymer film, except that on said substrate the inertia of the nanoclusters is not such as to permit their implantation. There is thus formation of a surface film of nanoclusters, the thickness of which (called "equivalent thickness") can be measured at the end of deposition of the nanoclusters using a stylus profilometer (by measuring the height of the step formed between the area of the "blank" on which deposition has taken place and that where deposition has not taken place because of masking by the aluminium foil); the purpose of this procedure is to provide independent checking of the amount of material deposited, and hence also of the amount implanted in the elastomer. At the end of exposure, the source of nanoclusters and the pumping systems of the expansion chamber and deposition chamber are switched off, and the latter is opened for removing the elastomer sample on which the implantation of nanoclusters has taken place.

Variants of the technique described above can envisage, for example, the use of an inert gas different from argon (e.g. helium), or of a reactive gas when it is desired to form nanoclusters of a material derived from reaction between said reactive gas and another element; the use of the starting material for formation of nanoclusters in a physical form other than solid, i.e. liquid or also in the form of gas and/or vapour; or, in the case when the material with which the nanoclusters are to be formed is in solid form, the use of a method different from the application of a potential difference for stripping atoms from said solid material (for example, laser ablation or similar).

Of course, given the statistical nature of the processes on which this technique is based, both the size of the nanoclusters and their velocity are to be understood as mean values of a distribution of said values. The nanoclusters thus produced are electrically neutral particles, and therefore can be implanted without problems of build-up of electric charge in the elastomers, which are normally electrical insulators. Moreover, the energy released to the substrate is very low (owing to the reduced kinetic energy of the nanoclusters, generally between a few meV per atom and a few eV per atom) and so do not induce appreciable heating of the polymer, and in particular prevent damage to the latter or to other previous functionalizations thereof, in contrast to what occurs in techniques such as ion implantation or the like, as discussed previously.

The nanoclusters usable for the purposes of the invention are constituted of a number of atoms varying between a few units and some thousands, and have dimensions between a few angstroms (Å) and some hundreds of nanometres (nm); preferably, these nanoclusters have dimensions smaller than 50 nm, and more preferably between approx. 1 and 10 nm.

The nanoclusters can be produced essentially from all the metals or semimetals, for example Au, Ag, Pd, Pt, Cu, Ti, Fe, Ni, Cr, Co, Nb, Zr, Al, C, V, Zn, Mo, W, Pb, Sn, Hf, Ir, alloys thereof or oxides thereof; in the case of deposits intended for the production of devices for implanting in living organisms (for example, in the human body), these metals or compounds must be limited to those that are biocompatible and non-toxic, so that, for example, metals such as Cr or Pb are to be excluded. The precious metals, in particular gold, platinum, silver and titanium or its oxides, are preferred for the purposes of the invention. Gold and platinum are preferred on account of their high electrical conductivity, chemical stability and biocompatibility. Silver is preferred on account of its particular bioactivity properties, such as antifoaming and antimicrobial agent, and its dielectrical properties. The oxides of titanium (to be understood as stoichiometric or non-stoichiometric compounds of general formula $TiO_x$, with $0<x\leq2$) are often used for biological applications, on account of their dielectric characteristics, transparency, biocompatibility and capacity for promoting cell growth.

All known elastomeric materials (both natural and synthetic) can be used for making the manufactured articles of the present invention; purely as examples, we may mention polysiloxanes (more commonly known as silicones), polyurethane elastomers, elastomeric fluoropolymers, elastomers based on polyolefins, polybutadiene (BR), styrene-butadiene rubbers (SBR), ethylene-propylene rubbers (EPR), ethylene-propylene-diene rubbers (EPDM), nitrile rubbers (NBR), acrylic rubbers (ACM) and those based on isobutylene and isoprene (IIR). Even if this is not included among the objects of the present invention, the technique can naturally be applied moreover to other polymers, such as for example polyurethanes, polyamides (PA), parylene (poly-paraxylene), fluoropolymers, polyolefins, collagens, chitin, alginates, polyvinylpyrrolidone (PVP), polyethylene glycol (PEG), polyethylene oxide (PEO), polyvinyl alcohol (PVA), polymers or copolymers of lactic and glycolic acids, polycaprolactone, polyamino acids and hydrogels. The polysiloxanes, polymers of general formula $(R_xSiO_{(4-x)/2})_n$, in which R is an organic radical such as methyl, ethyl or phenyl, and x is an integer between 1 and 3, are preferred for the purposes of the invention, especially when biocompatible manufactured articles are to be produced. Within this class, polydimethylsiloxane (PDMS) is particularly preferred, for the set of characteristics that it displays; this polymer in fact has notable resistance to temperature, to chemical attack and to oxidation, it is impermeable to water, it is an excellent electrical insulator, it is resistant to ageing, it is transparent, inert, non-toxic and non-flammable.

The elastomer can have any shape or thickness; in the majority of practical applications, however, manufactured articles are preferred in the form of sheets or films of small or very small thickness for the requirement, common in the production of electronic devices, of size reduction and integration thereof; this requirement is even more applicable in the field of devices for implanting in the body, in which the device must have the smallest possible dimensions to increase the patient's comfort and minimize possible interference of the device with the functionality of the part of the body in which it is inserted and the surrounding parts. The elastomeric substrates used in the invention typically have a thickness between approx. 500 nm and 1 mm, and preferably between approx. 5 and 300 µm. For the larger thicknesses in these ranges, the elastomer can be used in the form of a sheet produced beforehand and arranged on a sample holder of the apparatus. For reduced thicknesses, such as those in the preferred range defined above, the elastomeric layer is preferably produced directly on a rigid substrate (for example, a disk of planar silicon) by depositing the precursors of the polymer, for example in the form of a solution, on said substrate; by forming a film of the solution on the substrate, for example by rotating the substrate (a technique known as "spin coating"); by evaporating the solvent; and by submitting the film of precursors thus obtained to treatments (defined as "curing") that bring about its polymerization or crosslinking, such as thermal treatments or irradiation, typically with radiation of wavelength in the UV range. The substrate on which the film has been formed can then be used directly as the sample holder in the implantation phase. In the rest of the description reference will be made to this preferred embodiment of the method of the invention, which however remains of general applicability also to elastomers in the form of preformed articles (for example, sheets or complex three-dimensional strucutres).

The implantation of the nanoclusters in the elastomer leads to the formation, in a surface layer of the latter, of a nanocomposite, i.e. a volume of the material constituted of a dispersion of nanoparticles of a first material (metal or oxide) in the matrix of a second material (the elastomer).

The thickness of this surface layer is determined by the "depth of penetration" of the nanoclusters, i.e. the maximum distance from the surface that the particles reach in the selected operating conditions; the depth of penetration depends on various factors, and mainly the average velocity of the nanoclusters at the moment of impact on the elastomer surface (defined as "implantation velocity", measured from its component parallel to the beam axis) and their average mass, which determine the inertia of the nanoclusters, the temperature of the elastomer during deposition and, to a lesser extent, its chemical nature (for example the type of polymer, its degree of polymerization and degree of crosslinking, which together determine higher or lower resistance to penetration). For the purposes of the invention, typical values for these quantities are: a deposition temperature that can vary over a wide range, and can for example be between −210 and 150° C., preferably between 20 and 90° C., and more preferably room temperature; an implantation velocity between approx. 100 and 10 000 m/s, preferably between approx. 500 and 2000 m/s, and more preferably approx. 1000 m/s. In the practical execution of the method, for a given pair of materials (functional material and elastomer) and given characteristics of the implantation apparatus, the depth of penetration can be determined easily and optionally optimized to a desired value with a few preliminary tests.

Typically, the thickness of the nanocomposite layer is between 5 nm and 10 µm, preferably between approx. 50 nm and 1 µm, and more preferably it is controlled to values of approx. 100 nm.

Figure 2:
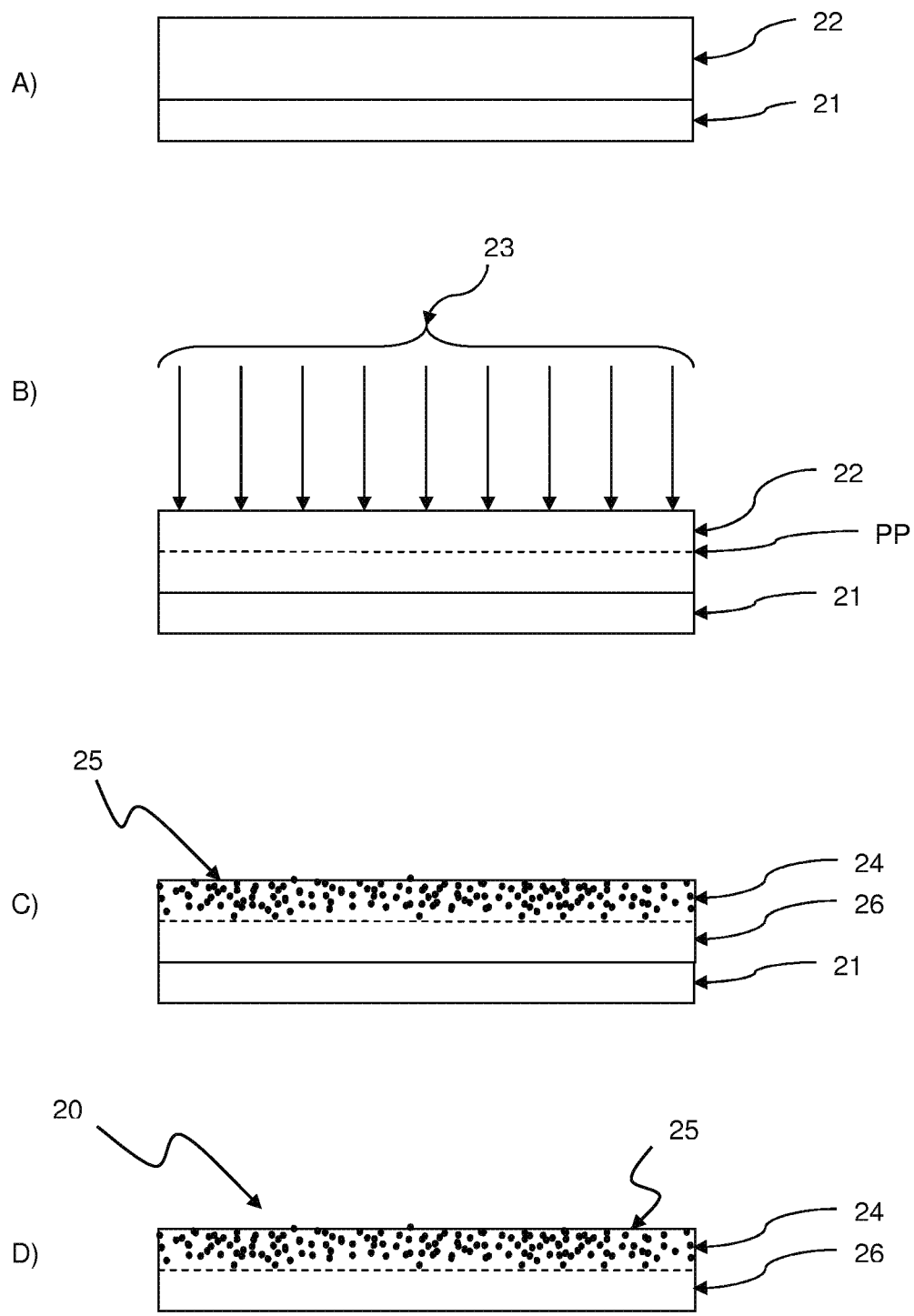
FIG. 2 shows, schematically and in section, an elastomeric manufactured article at different stages of execution of the method of the invention.

FIG. 2 shows the essential phases of execution of the method. In this figure, the elements are not shown to scale, and in particular the film thicknesses and the dimensions of the nanoparticles are much enlarged for clarity. FIG. 2 (A) shows schematically, in section, a substrate, 21, on which there is a film, 22, of an elastomer obtained for example by deposition of a solution of precursors on the substrate and polymerization in situ. FIG. 2 (B) shows the nanocluster implantation phase: the number 23 identifies the nanocluster beam that is incident on the top surface of the film 22; the nanoclusters penetrate into the elastomer as far as the depth of penetration (shown in the figure as PP), giving rise to the nanocomposite layer. FIG. 2 (C) shows the final result of the implantation phase, which consists of the manufactured article 20 in which a nanocomposite material 25 is produced in the upper portion 24 of the film 22, while the lower portion, 26, of the same film, remains free from nanoparticles. Finally, FIG. 2 (D) shows the final manufactured article, obtained by removing film 22 with the nanocomposite material 25 formed therein from substrate 21, for instance by "peeling off".

As clearly shown in FIG. 2 (C), the nanocomposite material is produced in such a way that no physical interface is formed between the nanocomposite material 25 and the lower portion 26 of film 22, i.e. no sharp physical interface between the nanocomposite material 25 in the upper portion 24 of the film 22 and the elastomeric polymer in the lower portion 26 of the same film is formed after the implantation process. The lack of any physical interface is very important in order to guarantee a good adhesion between the nanocomposite material 25 and the the lower portion 26 of the film 22 and, in particular, to guarantee mechanical resistance to the entire manufactured article 20; as known by those skilled in the art, the presence of a physical interface could represents a weak region of the manufactured article, that could lead to the breakage of the system when mechanical stress is applied. Another benefit of the method disclosed in the present invention is that, due to the particular physical process used, no other chemical compounds are used, apart from the polymer and the material of the nanoclusters. For example, chemical solvents or surfactants, which could compromise the biocompatibility of the final manufactured article, are not used during the nanocomposite formation process disclosed in the present invention. In particular, the polymeric part of the nanocomposite material is composed exclusively by the same monomers of the elastomeric film, i.e. is chemically identical to the polymer composing the elastomeric film.

Another important parameter for controlling the final properties of the nanocomposite layer is the "nanocluster density". For the purposes of the present invention, this value is defined as the number of implanted nanoclusters (the number of nanoclusters implanted in the polymer matrix at the end of the implantation process) per unit area of implantation measured in square nanometers, $nm^2$, divided by the thickness of the nanocomposite in nanometers; this quantity is expressed in dimensions of "number of particles/$nm^3$". It must be pointed out that after the implantation process, during subsequent treatments of the manufactured article, the number of nanoclusters included in the polymer matrix can vary due to coalescence and aggregation processes: the nanoclusters may undergo aggregation, giving rise to particles of larger dimensions, present in a smaller number than that obtained as a direct result of implantation. In this sense "the number of implanted nanoclusters" refers to the number of implanted nanoclusters at the end of the implantation process. Due to reduced mobility of nanoclusters in the elastomer body compared to atoms and ions, however, this phenomenon is of greatly reduced entity compared to what happens, e.g., with ion implantation. Similarly, due to aggregation, also the average size of the final nanoclusters can be slightly greater than that of the neutral clusters of the nanocluster beam (23 in FIG. 2 (B)), but the extent of this increase in dimensions is much lower than in case of ion implantation, and the nanoclusters in the final manufactured article have dimensions in a much narrower range than those obtained with said prior art technique. Moreover, the average size of the nanoclusters present in the nanocomposite layer is uniform throughout the nanocomposite material, not presenting a gradient in size distribution on the direction orthogonal to the surface of the nanocomposite layer, typical, for example, of ion implantation. Values of nanocluster density useful for the purposes of the invention are typically between $1 \times 10^{-5}$ and $1 \times 10^{-1}$ clusters/nm$^3$.

Furthermore, the inventors have found that the average size of the nanoclusters present in the nanocomposite material at the end of implantation process is in all cases comprised between the average size of the neutral clusters of the nanocluster beam and ten times said size, and is weakly dependent on the the density of nanoclusters of the nanocomposite layer. It is therefore possible to control the density of nanoclusters in the nanocomposite (or, the equivalent thickness of the deposit) almost independently by the average size of the nanoclusters in the nanocomposite. This, for example, is not possible by other synthesis approaches, such as, e.g., ion implantation. Since, as known by those skilled in the art, the average size of the nanoclusters is a parameter influencing many physical properties of the manufactured article, the almost independent control of the average size and of the density of the nanoclusters present in the nanocomposite, represents another benefit of the method disclosed in the present invention Finally, the present inventors have found that the top surface of the nanocomposite material 25 has a "surface roughness" comprised between 0.1 nm and 100 nm, and generally comprised between 1 nm and 10 nm, where by "surface roughness" is meant the root mean square surface roughness normally adopted in atomic force microscope (AFM) measurements and defined as known by those skilled in the art. This surface roughness, influenced by the average size of the nanoclusters in the nanocomposite, is strictly related to the method of production disclosed in the present invention; this roughness is likely responsible, at least in part, of the good biocompatibility of the manufactured articles of the invention, since, as known by those skilled in the art, surface roughness may improve, for example, cells adhesion on the surface. After formation of the nanocomposite, the polymer is preferably "annealed" to promote its structural and morphological rearrangement; in the case when the polymer is in the form of a film obtained by depositing the precursors of the polymer on a substrate as already described, and the curing process has only been carried out partially (i.e. for a period of time shorter than that stipulated), annealing can also promote complete polymerization and/or crosslinking thereof, finally consolidating the elastomer and producing a manufactured article with characteristics that are stable over time. Annealing can be carried out at temperatures roughly between 40 and 120° C. for times between approx. 15-20 minutes and 48 hours; the preferred annealing conditions are a temperature of approx. 90° C. and treatment for approx. 10 hours.

For making devices with electrical functionality, it is necessary for the deposits obtained according to the method of the invention to have defined geometry, for example in the form of linear traces that connect two points of the device. At these two points there can for example be two electrical contacts for detecting the electrical resistance in the trace, for making temperature sensors; typically, however, the devices are more complex, and the traces obtained according to the invention connect functional components of the device, such as resistances, capacitors and inductances or RF antennas; these components of the device can in their turn be produced using the method of the present invention in at least one or even all of the steps of a process for deposition of various functional layers, as known by a person skilled in the art of solid-state integrated circuits.

The production of traces, or of deposits with particular geometries, is described below with reference to two alternative embodiments.

Figure 3:
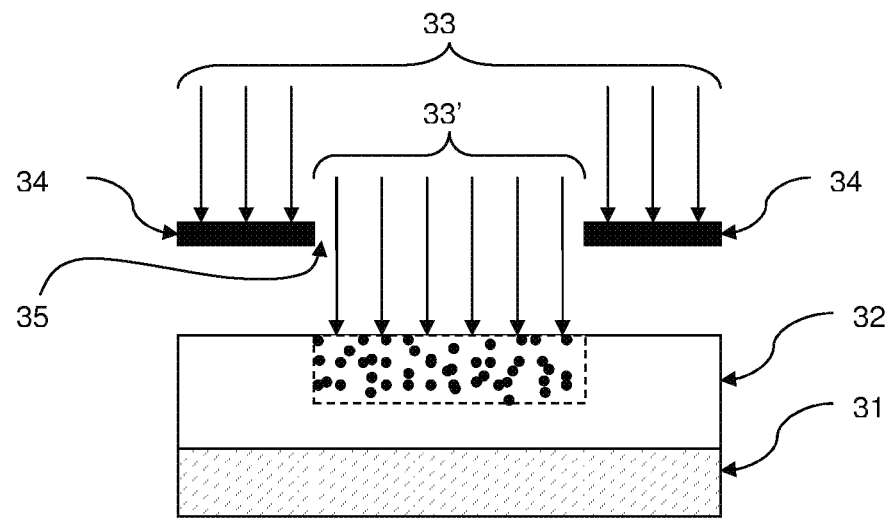
FIG. 3 shows, in a view similar to that of FIG. 2, an elastomeric manufactured article at various stages of a preferred embodiment of the method of the invention.
Figure 3:
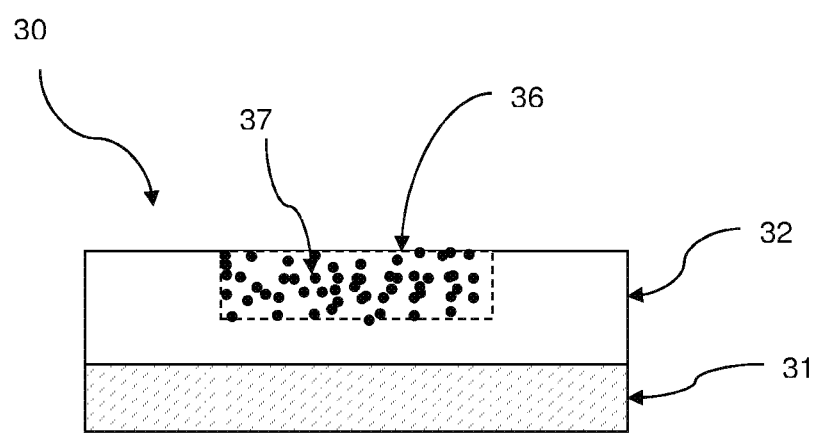

In the first embodiment, definition of the implantation zones is obtained by means of physical masks (better known in this sector as "stencil masks"), i.e. generally metal sheets but also plates of glass, plastic, silicon or ceramic, with thicknesses generally between approx. 100 μm and 1 mm, which have openings with shapes and dimensions corresponding to the desired implant geometry. This possibility is shown in FIG. 3: the elastomer film, 32, is produced on the substrate 31; at a certain distance from the upper surface of the elastomer, along the direction of the nanocluster beam 33, a mask 34 is placed, which intercepts part of said beam and allows another part thereof, 33', to pass through, corresponding to its opening 35. The product is the manufactured article 30 in which, in a portion 36 (identified in the figure by the dashed lines) of layer 32, a nanocomposite material 37 is produced. Stencil masks are well known in the microelectronics industry and do not require further description. In this embodiment, the stencil mask is maintained at a distance from the surface of the elastomer typically between approx. 50 and 500 μm; since the nanocluster beam is highly directional, these operating conditions provide a deposit that reproduces the shape and dimensions of the opening in the mask with an accuracy of approx. 0.5 μm. It is important to underline that the surface portion 36 in which the nanocomposite material 37 is present can be spatially localized in the elastomeric body both laterally, with a resolution better than 10 microns, and in the direction orthogonal to the surface of the elastomeric body, with a resolution better than 100 nm.

Figure 4:
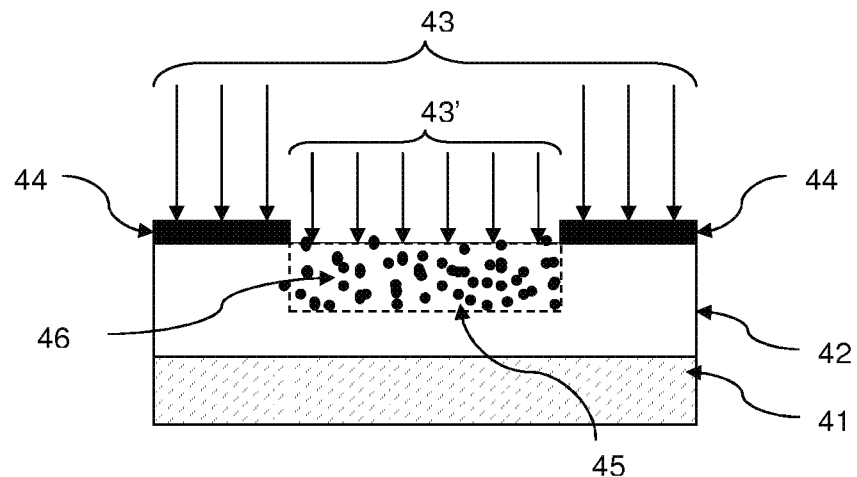
FIG. 4 shows, in a view similar to that of FIG. 3, an elastomeric manufactured article at various stages of a preferred embodiment of the method of the invention.

In the second embodiment, the mask is produced directly on the surface of the elastomer in which the deposit is to be produced, and is removed by dissolution at the end of the production operations. This embodiment is also well known in the microelectronics sector, and is known as the "lift-off" technique, and does not require detailed description. Briefly, the method consists in depositing, on the elastomer surface, a continuous film of a precursor, called "photoresist" or simply "resist", of a polymeric material; the film is then hardened selectively, by irradiation for example with UV radiation, only in some zones corresponding to the opening to be obtained or its negative, depending on the type of resist used; with a resist of the positive type, the irradiated zone becomes soluble in a suitable solvent, so that the use of this solvent on the resist exposed selectively to irradiation removes the irradiated portion, exposing the underlying elastomer, while the non-irradiated portion still covers the latter; with a resist of the negative type, the irradiated zone becomes insoluble in the solvent, so that subsequent treatment with the solvent removes the non-irradiated portion, exposing the elastomer in an area corresponding to the negative of the irradiated zone. In both cases, with a suitable combination of irradiation and selective washings, it is possible to expose only the portion (or portions) of the elastomer surface where the deposit is to be produced, protecting the other zones. At the end of the procedure, the masked part not removed by the first solvent is also removed, generally with a second solvent, releasing the elastomer surface. The use of a "resist" mask is shown in FIG. 4: the elastomer film, 42, is produced on the substrate 41; a mask 44 was produced on the upper surface of the elastomer, with one of the two alternative embodiments described above; a portion, 43', of the nanoclusters of beam 43, corresponding to the opening in the mask, arrives on the surface of the elastomer and forms, in portion 45 (identified in the figure with dashed lines) of the film 42, the nanocomposite material 46; the portion of the nanoclusters that arrives on the mask 44 is implanted in the material of the latter and is removed during its dissolution.

It is of course possible for the operations described above to be repeated several times (including, in the case of elastomer film produced directly on the substrate for example by spin-coating, the operations of deposition and curing of further polymer layers), in conditions or with embodiments that are identical or different in the various successive operations, to obtain complex "architectures" of successive layers, with identical or different functionality, for the purpose of producing devices with particular electrical functionalities; it is also possible, at the end of an operation or of a series of operations as described above, to carry out one or more similar operations on the opposite face of the semi-finished article (simply by turning it over when using an elastomer sheet, or detaching it from the substrate and exposing the face originally in contact with the latter in the case of elastomer film produced directly on the substrate). As a simple example, it is possible, keeping the same masks, to produce a nanocomposite layer constituted of three levels, a first level that is a conductor of electricity, a second level that is an insulator, and a third level that is again a conductor, thus constituting a capacitor. Various levels can communicate electrically with one another for example using the well-known method of "vias", i.e. openings made through the full height of a layer and then filled with a metal, to provide electrical continuity between two traces positioned at different levels of the device. Other methods and other architectures that can be used for obtaining functionalities required for the production of flexible electronic devices will be apparent to a person skilled in the art of microelectronics.

Different parts of the nanocomposite with different functionalities can be obtained either by modifying the functional material of the individual operations, or by modifying some operating conditions thereof. For example, it is possible to adjust the conduction characteristics in the nanocomposite, while still using a conductive material (e.g. gold), by acting on the "nanocluster density" described previously. The inventors have observed that there is a critical value of this parameter (called "critical density", or $d_c$), below which a nanocomposite produced with particles of a conductive material is nevertheless an insulator, whereas above this value the nanocomposite layer acquires properties of electrical conductivity; the definitions of insulator and conductor are those normally applied to these terms, i.e. insulator means here a trace of nanocomposite that does not allow the passage of a measurable current (using measurement instruments of a standard electronic equipment) on applying a potential difference to its two ends, whereas conductor means a trace of nanocomposite in which, on applying a potential difference, V, to the two ends, a current I flows that is proportional to the potential difference, according to the well-known Ohm's law I=V/R, in which R is the resistance of the conductor. The value of the critical density is specific for the polymer used, and can easily be identified by a person skilled in the art with a few preliminary tests.

For example, in the case of a PDMS film, the inventors identified that the value of $d_c$ can vary from approx. $3 \times 10^{-4}$ to approx. $1 \times 10^{-3}$ clusters/nm$^3$. Insulating traces can be produced in the elastomer film with values of nanocluster density below the critical density, while for the production of conductive traces it is preferable to work with densities greater than 1.5 times the critical density.

The inventors have found, moreover, that it is possible for the behaviour of the conductive traces to be differentiated further. By working with nanocluster densities above $d_c$ and lower than approx. three times $d_c$, conductive traces are obtained whose resistance changes considerably as a result of elongation of said traces, which are defined hereunder as "piezoresistive stretchable conductors". For example, in the case of traces of PDMS, piezoresistive stretchable conductors are obtained for densities greater than approx. $1 \times 10^{-3}$ clusters/nm$^3$ but less than approx. $5 \times 10^{-3}$ clusters/nm$^3$, and preferably between approx. $1.5 \times 10^{-3}$ clusters/nm$^3$ and $4 \times 10^{-3}$ clusters/nm$^3$ (obtaining, for example with changes in the value of the resistance of the trace greater than 500% for extensions of the manufactured article equal to 40%). Conversely, by working with nanocluster densities greater than approx. three times $d_c$, traces are obtained, defined hereunder as "resilient stretchable conductors", whose conductivity varies little following elongation. For example, in the case of traces of PDMS, for densities greater than approx. $5 \times 10^{-3}$ clusters/nm$^3$, changes in the resistance value of the trace of less than 250% were observed for extensions of the manufactured article equal to 40%. The resilient traces can be produced when it is desirable for the trace itself to have constant electrical characteristics, even after elongations of the manufactured article or device in which it is present; conversely, the piezoresistive traces can be exploited beneficially in the production of deformation sensors.

The inventors have observed that, by using transparent elastomer films and for values of nanocluster density less than approx. ten times $d_c$, the nanocomposite material obtained is semitransparent, i.e. permits the transmission of visible light.

Figure 5:
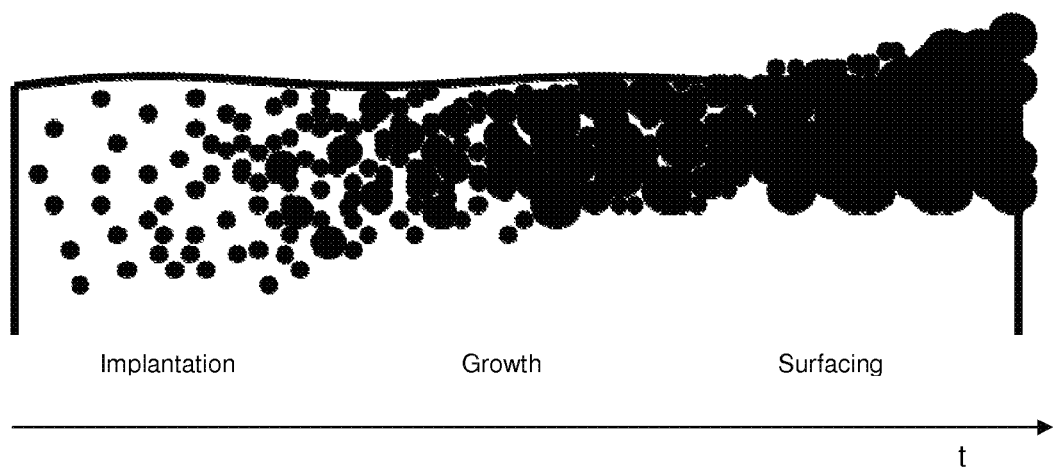
FIG. 5 shows, schematically, the growth of a deposit of nanoclusters obtained according to the invention as a function of the deposition time.

As stated previously, the depth of penetration represents the maximum depth beneath the polymer surface reached by the nanoclusters; with increase in nanocluster density in the polymer matrix of the nanocomposite as the implantation process is prolonged, the nanoclusters gradually encounter greater difficulty in penetrating into the polymer and consequently are stopped at gradually decreasing distances from said surface. Growth of the nanocomposite layer then occurs more and more towards the surface of the polymer itself, until, if implantation is continued for a sufficient time, the nanoclusters begin to emerge on the surface of the nanocomposite. This situation is represented in FIG. 5, which shows the development of the deposit of nanoparticles as the implantation time is increased. In this figure, the vertical lines and the upper wavy line represent the contours of the elastomer film viewed in section; the horizontal coordinate represents the deposition time. At the beginning of the process (short times, left-hand part of the figure) the nanoclusters are small and are isolated inside the polymer matrix;

at an intermediate time (central part of the figure) the nanoclusters have begun to grow in size by aggregation with one another, and begin to be in mutual contact creating, in the case of conductive particles, a percolative conduction path through the nanocomposite material; at long implantation times (right-hand part of the figure) the nanocluster layer grows towards the top of the nanocomposite layer, until it emerges on the surface of the latter. The state of emerging nanoclusters thus obtained presents intrinsically high adhesion to the elastomer, and can pass the standard test of adhesion known as the "Scotch tape adhesion test" or can withstand treatment with ultrasound in aqueous or organic solvents (for example ethanol) for at least 60 minutes without detaching from the polymer. This emerging layer can then also constitute an excellent substrate for growth of a more compact metal layer (of the same metal of the nanoclusters or different), for example by electrodeposition. The method of the invention therefore provides an alternative method to the known methods for making metallic deposits compatible with an elastomer surface, making it unnecessary to use metals that are not biocompatible (such as Cr) or techniques such as plasma treatments, at the same time providing better adhesion of the metal trace. According to this embodiment, the nanocomposite layer can also function as an "emergency conductive layer" for the main conductor constituted of the overlying continuous metal trace, in which the nanocomposite ensures electrical continuity of the trace in case of breakage in the main conductor.

The nanocomposite layers obtained according to the invention, optionally covered with continuous metal layers, can be left exposed in the final device, but in the majority of applications, for example in devices for implanting in the human body, parts of these can be covered with additional elastomer layers so that they are encapsulated and therefore isolated from contact with the outside; isolation from the outside has the purpose, on the one hand, of preventing for example contact with saline solutions (typically present in the human body) that might alter the operation of the device, either by short-circuiting it or by modifying the chemical nature of the nanoclusters over time, and on the other hand of avoiding electrical leakage in the body. Portions of the nanocomposite layers, optionally covered with continuous metal layers, can however be maintained as emerging, by means of vias in the encapsulating polymer layers, for the purpose of utilizing these portions as electrodes (or microelectrodes, if they are of micrometric dimensions) and/or contacts. In the case of electrodes, these can be used for supplying electrical signals to the surroundings in which the final device is inserted (for example a tissue of an organism or of individual cells), or for detecting electrical signals in a similar environment. In the case of contacts, these can be used for interconnecting the final device with other devices, for example units for power supply or for signal acquisition and processing. Inside said device, there can be electrodes used both for supplying and for detecting electrical stimuli, and contacts. It should be emphasized that especially in the case when the device is to be implanted in a living organism or is to be used for investigating biological systems in vitro, biocompatibility of these electrodes and/or contacts is an essential condition. The emerging portions of nanocomposite layers (optionally covered with continuous metal layers) can also be used, in some configurations, as sites of cellular growth.

The encapsulating elastomer layers can be produced in the same way as the elastomer films in which the nanocomposite is obtained, i.e. for example by deposition of a solution of precursors on the surface to be covered and then polymerization and/or crosslinking in situ, on elimination of the solvent.

The method of the invention makes it possible, moreover, to produce both devices that are implantable in living organisms and devices for use outside of organisms, for example for analysis in vitro. In the latter case the method proposed can be used, for example, for making series of microelectrodes (used, for example, for electrophoresis or stimulation of cells), circuit elements (for example resistances, temperature sensors, chemical sensors, pH sensors or capacitive sensors) and/or for functionalizing polymeric bases for the purpose of increasing their biocompatibility or supplying stimuli to the biological system (for example by promoting cellular growth or cellular differentiation).

The invention will be illustrated further with the following examples.

Example 1

This example relates to the production of a manufactured article constituted of a nanocomposite layer in the surface part of an elastomer film.

An elastomeric PDMS film is produced separately, to be used as substrate for deposition. A dose of approx. 5 grams of PDMS is prepared by mixing a polymer base of Sylgard 184 (Dow Corning) with the appropriate curing agent in 10:1 ratio. The mixture, contained in a beaker, is put in a chamber evacuated by means of a membrane-type vacuum pump, and maintained at a pressure of approx. 13 Pa for 30 minutes, in order to expel any air bubbles from the mixture. The product thus obtained is then deposited on a commercial silicon substrate of dimensions 2 cm×6 cm (obtained by cleavage of a wafer of crystalline silicon, with a diameter of 4 inches, thickness of approx. 300 µm, polished on the surface where deposition of the polymer is performed) by "spin-coating", a standard technique known by a person skilled in the art. The spin-coater parameters used in this example are a speed equal to 1000 rpm and a spinning time equal to approx. one minute. Next, the film is heated at a temperature of 100° C. for approx. 45 minutes (curing process). The film obtained has a thickness of approx. 100 µm and the same dimensions of the substrate.

A system is then set up for the production and deposition of nanoclusters comprising a source with an inseminated gas beam of nanoclusters, of the type described previously with reference to FIG. 1. In this system, the cavity of the source has a volume of approx. 2.5 cm$^3$; inside the cavity, and orthogonally to it, there is a rod of gold of 99.99% purity with a diameter of 2 mm, which is rotated at 4 rpm; Ar of 99.9999% purity is injected into the cavity by the solenoid valve, at an inlet pressure equal to 40 bar. The anode of the source is constituted of a perforated copper disk with a diameter of 2 cm with a 1 mm hole at the centre. The nozzle used has a 2 mm orifice and downstream from this there is a collimator with aerodynamic lenses, composed of four stages in sequence, each of which is in its turn composed of a hollow metal cylinder with an inside diameter of 10 mm and a height of 28 mm; the stages are interconnected with each other by aerodynamic lenses constituted of steel disks with a diameter equal to that of the hollow cylinders and with a central hole 2 mm in diameter. The last stage is in its turn connected to the expansion chamber via another aerodynamic lens with an orifice with a diameter of 1 mm.

A pressure of $9.3 \times 10^{-5}$ Pa is established in the expansion chamber by a pumping system comprising a "Roots" pump and a turbomolecular pump.

The procedure for production and deposition of the nanoclusters is then started, operating in pulsed regime with a frequency of 5 Hz. At each cycle the solenoid valve is opened for 300 µs and, after a delay time of 0.43 ms from valve opening, a voltage of 850 V is applied between the anode and the cathode of the source for a time of 80 µs. A mixture of argon and gold nanoclusters is generated, having a pressure of approx. 0.27 bar. Owing to the pressure difference between the cavity of the source and the expansion chamber, the mixture is accelerated towards the latter and then towards the PDMS film, thus producing a beam of gold nanoclusters with an average velocity of approx. 1000 m/s.

The expansion chamber communicates with the deposition chamber via a skimmer with a 3-mm hole at the vertex. The deposition chamber is connected to a second pumping system, similar to the previous one, which maintains an average pressure of approx. $6.7 \times 10^{-3}$ Pa inside the chamber during operation of the source.

In the deposition chamber, orthogonally to the beam axis and turned towards the nanocluster beam, there is a sample holder of approx. 10 cm×10 cm on which, before evacuating the deposition chamber, the polymer film (supported by the silicon substrate) previously produced is positioned. Furthermore, a stencil mask is interposed between the surface of the polymer and the nanocluster beam. This mask is composed of a sheet of steel (with thickness of approx. 300 µm) in which slits have been made by laser cutting. These slits are made up of a central channel, with a length of 10 mm and a width of 500 µm, with two square zones of 1 mm×1 mm at its ends. The mask, produced by a person skilled in the art, is positioned at a distance of approx. 300 µm from the surface of the polymer, and is integral with said polymer and with the sample holder. By interposing the stencil mask on the polymer film, only the areas of the polymer film corresponding to the slits in the mask will be exposed to the nanocluster beam. The sample holder is moreover connected to a remote-controlled motorized system, which is able to move said sample holder (and consequently the polymer film and the stencil mask) in the two directions orthogonal to the axis of the cluster beam and enabling to perform "rastering" over an area of 3×8 cm², in order to expose to the nanocluster beam the complete region of the sample holder where the polymeric film and the stencil mask are positioned.

Before and during exposure, the polymer film is maintained at room temperature (equal to approx. 20° C.). The exposure time is 90 minutes. A deposit is obtained with equivalent thickness, measured by means of a profilometer (as known by those skilled in the art) on a silicon sample (the "blank") placed on the sample holder and exposed to "rastering", of 50 nm.

At the end of nanocluster implantation, the sample is taken out of the deposition chamber and is put in an evaporator (operation of which is known by a person skilled in the art), after putting in place a second stencil mask that is able to mask the central channels, with a length of 10 mm and a width of 500 µm, of the previous stencil mask. The combination of the two masks keeps only exposed the square portions of the slits (of 1 mm×1 mm) at the ends of the central channel. Thus, a surface film of gold, 50 nm thick, is deposited on the aforementioned square portions.

The manufactured article (i.e. the PDMS polymer film with the overlying metallized traces) is then separated from the silicon substrate by "peeling" (a process known by a person skilled in the art), using ethanol to facilitate the operation.

Figure 6:
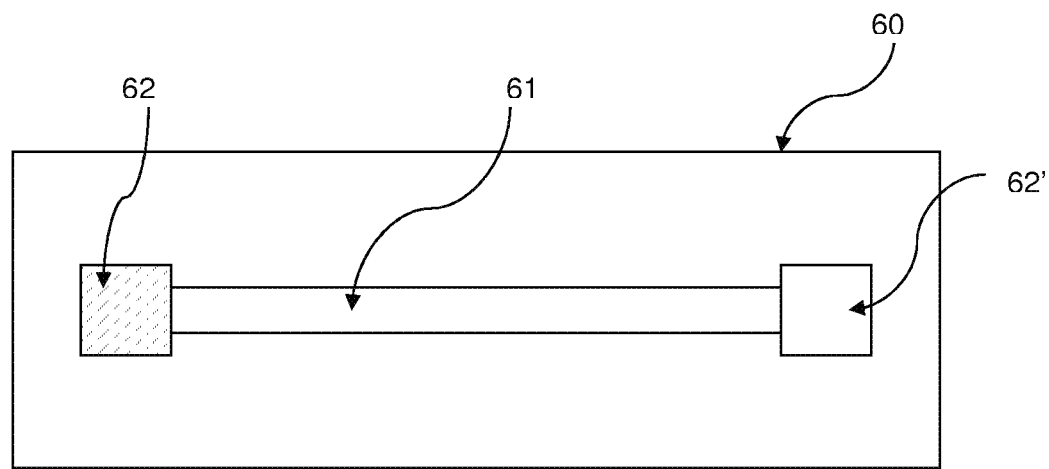
FIG. 6 shows, in a top view, a possible manufactured article of the invention.

The manufactured article thus obtained is represented in a schematic top view in FIG. 6; the manufactured article 60 has, in its upper surface, a nanocomposite channel 61 (composed of gold nanoparticles implanted in the PDMS polymer matrix) of dimensions 10 mm (length)×500 µm (width)×an effective thickness corresponding to 50 nm of equivalent thickness, and at the ends of this channel, two square metallized zones ("pads" 62 and 62') with an area of 1 mm², composed of a nanocomposite layer (also of gold nanoparticles implanted in the PDMS polymer matrix and with the same effective thickness) covered by a surface film of gold with thickness of 50 nm. These pads are intended for electrical contact with the outside.

Example 2

This example relates to the production of two manufactured articles, following the same procedure described in example 1, but with different metals.

The first manufactured article is produced by repeating the procedure of example 1, using silver (Ag) instead of gold as starting metallic material for the implantation process. In this case, the film is exposed to the silver nanocluster beam by rastering (as described in example 1) for a sufficient time (180 minutes) to obtain a deposited equivalent thickness of approx. 150 nm (measured, as previously done, with a profilometer on a "blank" silicon sample).

The second manufactured article is produced by repeating the procedure of example 1, using titanium (Ti) instead of gold as starting metallic material for the implantation process. In this case, a delay time of 0.68 ms is set and the solenoid valve is opened for 200 µs at each cycle. The film is exposed to the titanium nanocluster beam by rastering (as described in example 1) for a sufficient time (180 minutes) to obtain a deposited equivalent thickness of approx. 200 nm (measured, as previously done, with a profilometer on a "blank" silicon sample).

The results obtained with these two manufactured articles are similar to the ones obtained with the manufactured article produced in the example 1 and confirm, in general, that it is possible to use the method disclosed in the present invention also with other materials as starting metallic material for the implantation process.

Example 3

This example demonstrates the possibility of producing, with the method of the invention, manufactured articles constituted of traces of micrometric dimensions composed of a nanocomposite layer in the surface part of an elastomer film.

Figure 7:
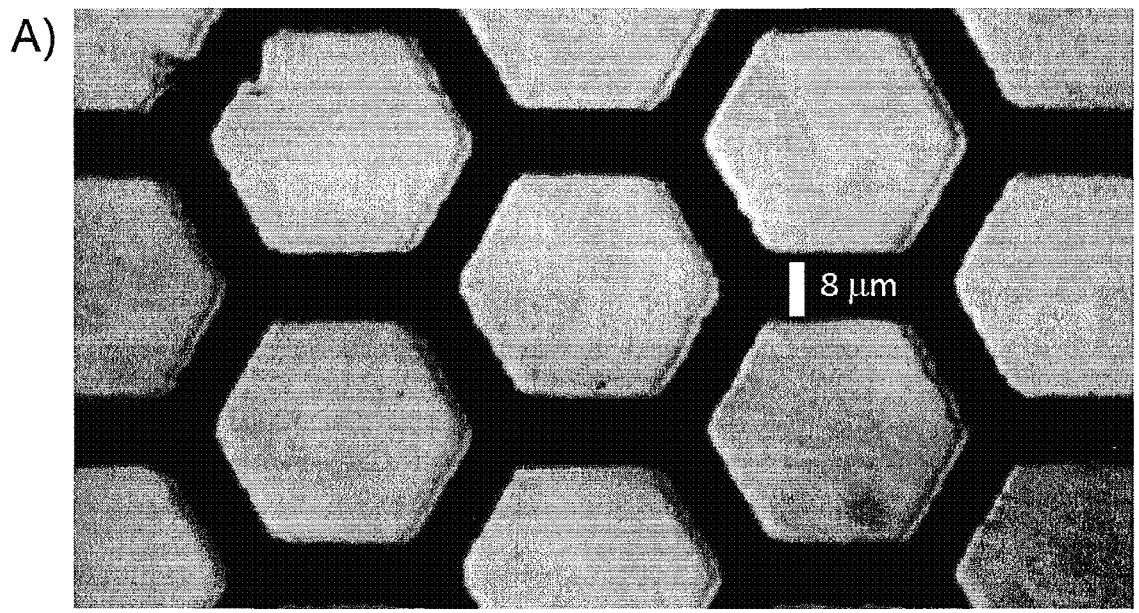
FIG. 7 shows microphotographs of two manufactured articles produced according to the invention.
Figure 7:
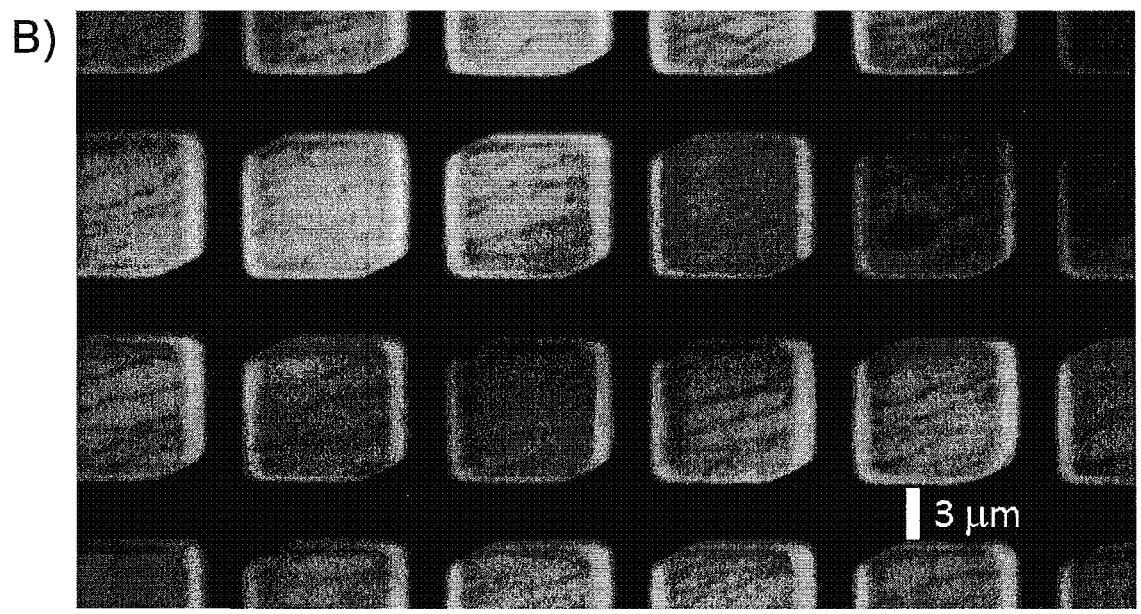

A first manufactured article is produced repeating the procedure of example 1, using, as stencil mask, a G2760N grating from Agar Scientific Ltd. (Essex, GB) with a grid of hexagonal openings; the deposition conditions are such that the nanocomposite deposits produced have an effective thickness corresponding to 50 nm of deposited equivalent thickness (measured as in example 1, with a profilometer on a "blank" silicon sample). FIG. 7 (A) is the photograph acquired by light microscopy of part of the manufactured article (at 50× magnification): the bright parts are those in which the gold nanocomposite was formed, while the darker parts around the nanocomposite deposits represent the parts of PDMS in which nanocluster implantation did not take place.

A second manufactured article is produced using a G2786N grating from Agar Scientific Ltd. (Essex, GB) with a grid of square openings as stencil mask, with the same procedure described above. Results are shown in FIG. 7 (B), which is the photograph acquired by the same light microscopy of part of the manufactured article (at 50× magnification). Also in this case the bright parts are those in which the gold nanocomposite was formed, while the darker parts around the nanocomposite deposits represent the parts of PDMS in which nanocluster implantation did not take place.

As is clearly shown from the pictures in this figure, with the method of the invention it is possible to produce nanocomposite deposits of micrometric dimensions with high accuracy.

Example 4

This example relates to the analysis through transmission electron microscopy (TEM) technique of the internal structure and the morphological characteristics of a manufactured article of the invention.

An elastomeric PDMS thick film is produced separately, to be used as substrate for deposition. A dose of approx. 1 grams of PDMS is prepared by mixing a polymer base of Sylgard 184 (Dow Corning) with the appropriate curing agent in 10:1 ratio. The mixture, contained in a cylindrical beaker with base radius of approx. 18 mm, is put in a chamber evacuated by means of a membrane-type vacuum pump, and maintained at a pressure of approx. 13 Pa for 30 minutes, in order to expel any air bubbles from the mixture.

The cylindrical beaker, containing the mixture freed by air bubbles, is then heated at a temperature of 100° C. for approx. 45 minutes (curing process). The PDMS polymer thick film is then separated from the beaker by "peeling", using ethanol to facilitate the operation. The film obtained has a thickness of approx. 1 mm. A portion with dimensions of 5 mm (length)×1 mm (width) is cut out from the thus obtained film, and it is placed on a commercial silicon substrate of dimensions 1 cm×1 cm×approx. 300 µm.

A manufactured article is then produced by repeating the implantation procedure of example 1, performing "rastering" over an area of 2×2 cm², without using a stencil mask and positioning the PDMS portion supported by the silicon substrate in the sample holder 123 of FIG. 1, such that the nanocluster beam is incident on the top surface of the thick PDMS film. The exposure time (10 minutes) is sufficient to obtain a deposit of gold nanoparticles in the upper portion of the PDMS film, forming a nanocomposite layer, with equivalent thickness of 35 nm. The equivalent thickness is measured by a profilometer on a "blank" bare silicon sample placed on the sample holder next to the PDMS film and exposed to "rastering". The manufactured article is then separated from the silicon substrate by "peeling", using ethanol to facilitate the operation.

The thus obtained sample is then prepared for TEM analysis. TEM lamellae are prepared using a cryoultramicrotome at −120±5° C., following standard operating procedures. After the sample has been fixed to the holder of cryoultramicrotome and reaches thermal equilibrium with the knife and chamber, lamellae are sliced with a glass knife at a sectioning speed of 1.0 mm/s. A perfect loop (as known by those skilled in the art) is used to transfer the slices from the blade to a formvar-coated TEM grid (300 mesh). The section thickness of the slices is approx. 300 nm.

Figure 8:
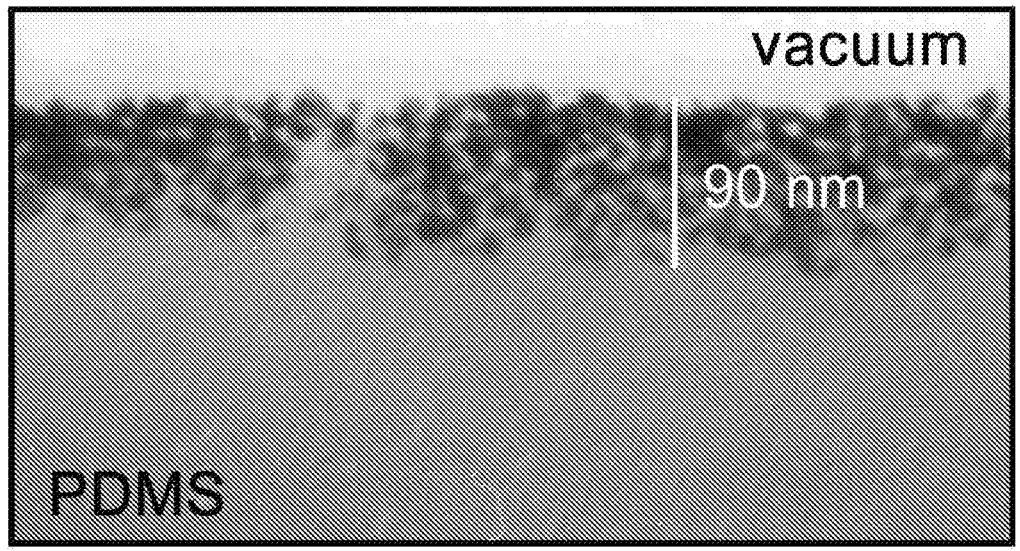
FIG. 8 shows micrographs taken with a transmission electron microscope (TEM) on two samples of manufactured articles of the invention.
Figure 8:
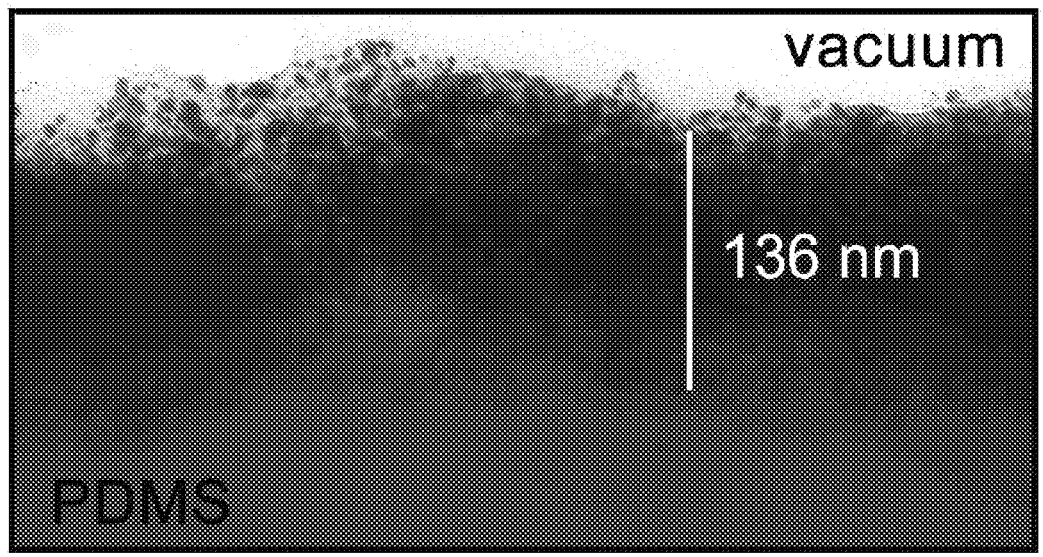

The grid with the slices are then analyzed with a TEM microscope. A TEM micrograph of the nanocomposite layer is shown in FIG. 8 (A). The micrograph in FIG. 8 (A) clearly shows than the nanocluster implantation procedure previously described has produced a nanocomposite layer having a thickness of about 90 nm.

A second manufactured article is then produced following the same procedure described above, but adopting an exposure time (35 minutes) sufficient to obtain an equivalent thickness of 120 nm (measured by means of a profilometer). Subsequently, a TEM grid with slices of this sample is prepared following the same method as above and then analyzed with a TEM. The TEM micrograph of this second nanocomposite layer is shown in FIG. 8 (B). The micrograph in FIG. 8 (B) clearly shows than the nanocluster implantation procedure previously described has produced a nanocomposite layer having a thickness of about 136 nm.

Example 5

This example relates to evaluation of the electrical characteristics of a manufactured article of the invention after cycles of elongation and relaxation.

A manufactured article (shown in a schematic top view in FIG. 9) is produced by repeating the procedure of example 1, using a stencil mask such that the nanocomposite channel produced (91, 91', 91") has the dimensions 10 mm (length)×5 mm (width), performing "rastering" over an area of 2×2 cm² centred on the region of interest, and an effective thickness corresponding to 400 nm of equivalent thickness (as explained in example 1), and the two metallized pads (92 and 92'), overlaying the ends 91 and 91" of the nanocomposite channel, have dimensions of 5 mm×5 mm (the effective thickness of the nanocomposite in these corresponds to an equivalent thickness of 400 nm, while that of the overlying vapour-deposited gold film is 50 nm). In this case the time of exposure to the nanoclusters (2 hours) is such as to permit exposure of the area covered by rastering to an equivalent thickness of approx. 400 nm (measured, as previously done, with a profilometer on a "blank" silicon sample). The polymer film 90 has the dimensions 2 cm (width)×4 cm (length)×100 µm (thickness), and the metallized trace (i.e. the channel and the two pads) is produced in such a way that the centre of symmetry of the trace corresponds to the centre of symmetry of the polymer film, and so that the axis of symmetry of the trace is parallel to the longer edge of the film (i.e. that of length equal to 4 cm).

Figure 9:
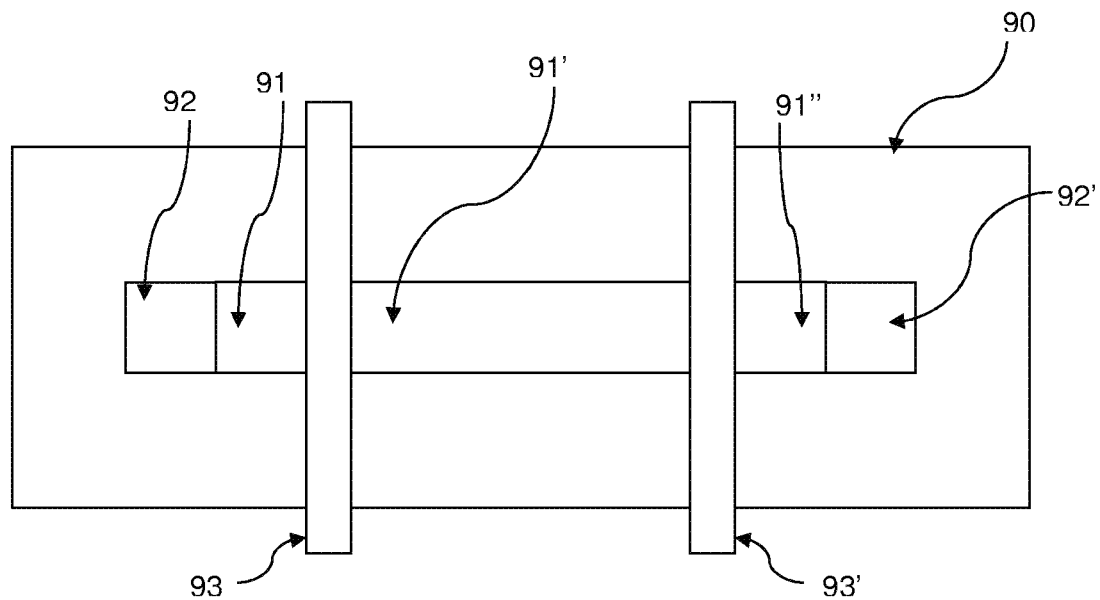
FIG. 9 shows the manufactured article of FIG. 6, to which clamps have been connected for tests of electrical resistance during deformation of the manufactured article.
Figure 10:
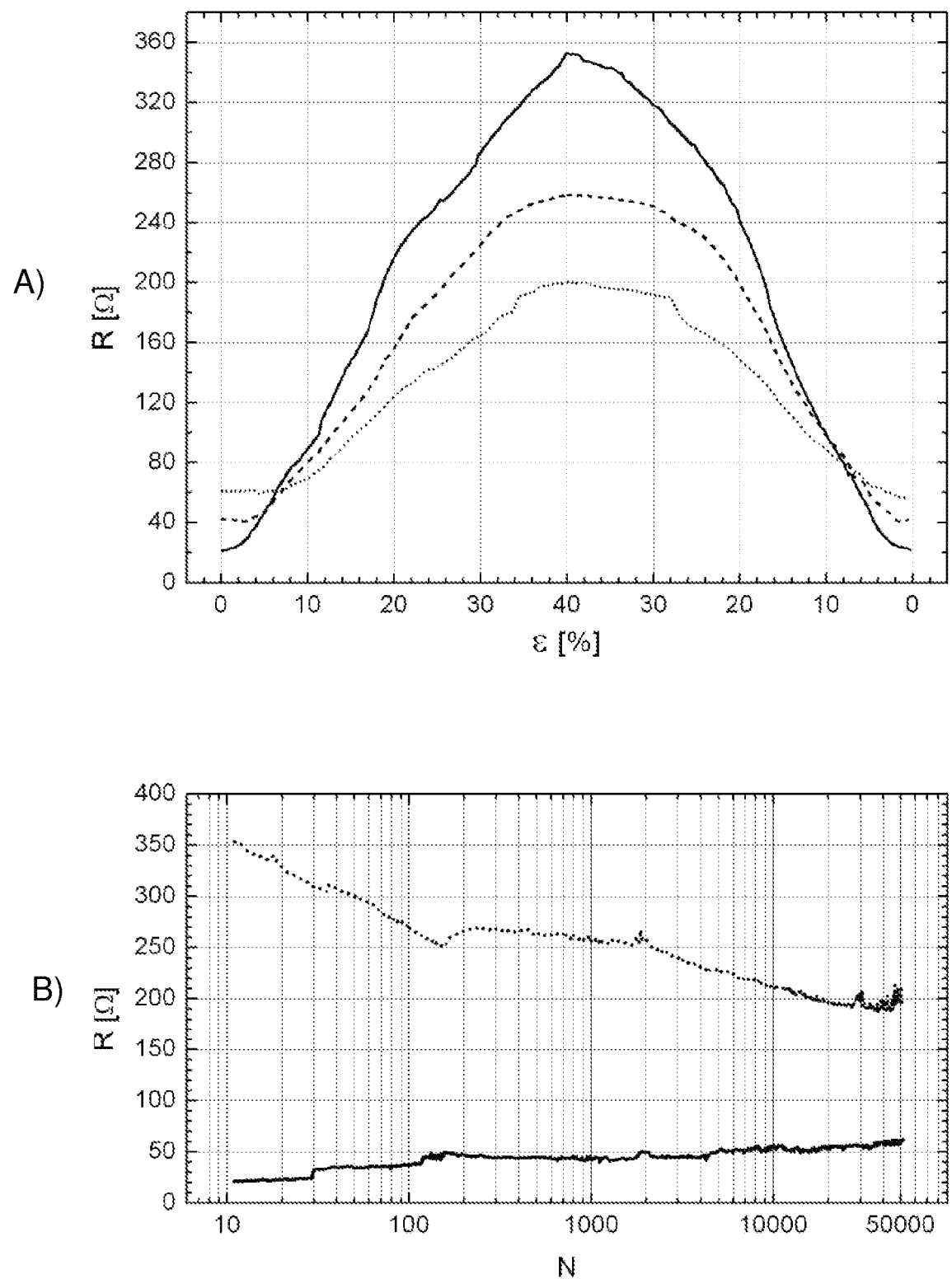
FIG. 10 shows the result of resistance measurements of the manufactured article of FIG. 9 in various cycles of elongation/relaxation.

For evaluating the electrical characteristics of the manufactured article of the invention upon cycles of elongation and relaxation, the manufactured article is fixed in an stretcher. This stretcher is provided with electrically insulated clamps (93 and 93') which make it possible to anchor the polymer film in two regions as shown in FIG. 9. The two clamps are adjusted so as to guarantee secure fixing (which prevents slippage of the film during extension) and so that zone 91 of the film is not retained by the clamps. In this example, the area of zone 91 that can be extended and is not constrained by the clamps has dimensions of 8 mm (length)×5 mm (width). One of the two clamps is integral with a micrometer slide, controlled by a stepping motor, which causes alternating motion in the direction parallel to the axis of symmetry of the trace; this motion consists of cycles of elongation of the trace by 40% relative to its initial value, and return to the initial dimensions (contraction); each cycle of extension/contraction lasts approx. 30 seconds. The two pads (92 and 92') are connected to the electrodes of a multimeter that records the resistance of the nanocomposite trace during the test, which is done continuously for 50000 cycles. In particular, at regular intervals (initially approximately once every 10 cycles, then starting from cycle number 500 once every 100 cycles), cycles of extension/contraction each lasting approx. 1200 seconds are carried out; during these slower cycles it is possible to take more precise measurements of the value of resistance of the manufactured article as a function of the percentage elongation. The test results are presented in FIG. 10. FIG. 10 (A) shows curves of the variation of the electrical resistance of the nanocomposite trace (91 in FIG. 9) as a function of specimen elongation; the resistance (R, measured in Ω) during the test is shown on the ordinate, and the percentage elongation (ε %) is shown on the abscissa; the abscissa has a left-hand part showing elongation increasing from 0 to 40%, while the right-hand part shows the relaxation of the film, i.e. its return from maximum elongation (40%) to the dimension at rest (0%). Three curves are shown (obtained during three of the cycles with duration of 1200 seconds): the solid curve corresponds to measurement of the electrical resistance during the tenth cycle of elongation/relaxation, the dashed curve corresponds to the same measurement in cycle number 1000 and the dotted curve corresponds to the same measurement in cycle number 50000. FIG. 10 (B) shows instead the values of maximum resistance (upper curve) and minimum resistance (lower curve) in each cycle as a function of the number of cycles (N).

The results of this test show that the conductive nanocomposite trace obtained according to the method of the present invention remains conductive even after elongation of 40%, although with an increase in resistance at the moment of maximum elongation of the specimen (curves in FIG. 10 (A)). This characteristic is already in itself a notable improvement relative to the possibilities offered by the systems of the prior art, in particular in the case of rectilinear traces (not undulating or zigzag). In addition to this first advantage, it is to be noted that the specimen displays notable resistance to stresses and strains, maintaining its characteristics for 50000 cycles. What is even more surprising, however, is the variation of the electrical resistance of the specimen in successive cycles; instead of increasing as a result of gradual deterioration of the device such as occurs with the devices of the prior art, the electrical resistance shows a tendency to improvement with increase of said cycles, with curves of electrical resistance in the individual cycles that tend to become flatter (FIG. 10 (A)); this variation is clearly seen in the graph in FIG. 10 (B), which shows that, with increase in the number of cycles of elongation/relaxation, there is a slight increase in resistance at rest and a considerable reduction in the value of resistance at maximum elongation. A device comprising a conductive trace made according to the invention thus has reliability that increases over time, instead of undergoing the "ageing" that is typical of the devices of the prior art.

Example 6

This example relates to evaluation of the mechanical and electrical performances of a manufactured article of the invention during a maximal elongation test.

A manufactured article is produced by exactly repeating the procedure of example 5; is obtained an article having a geometry of nanocluster deposits shown in a schematic top view in FIG. 9, with a nanocomposite trace 91 suitably shaped for resistance measurements.

The manufactured article is then fixed in a stretcher as described in example 5, for evaluation its electrical performances upon elongation. In this case, the manufactured article is elongated until an electrical failure or a rupture of the polymer film occurs; either of these events determine the "maximal strain" that the manufactured article can support. During the elongation cycle, which ends once the maximal strain is reached, the electrical resistance of the manufactured article as a function of specimen elongation is recorded.

Figure 11:
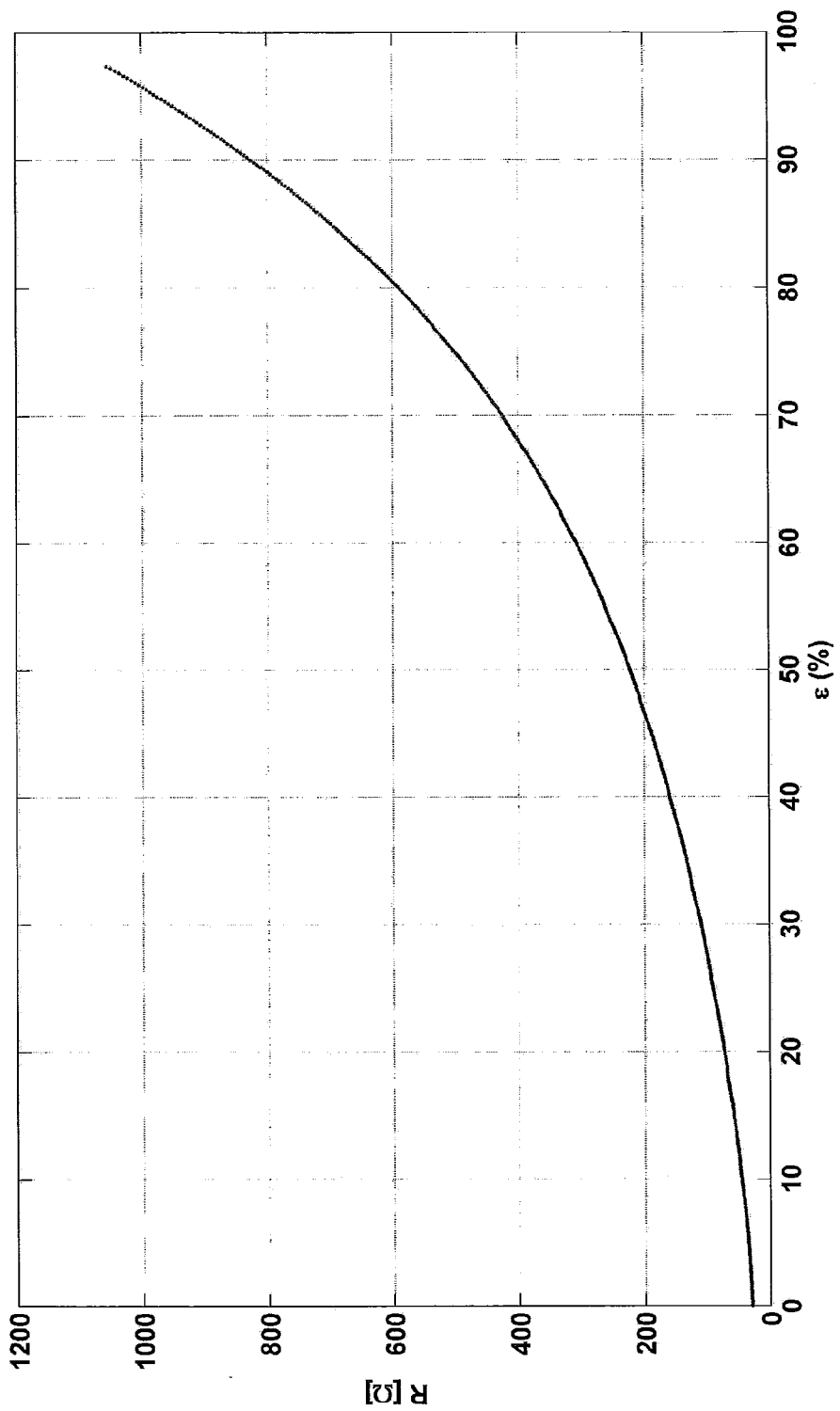
FIG. 11 shows the result of a resistance measurement of a manufactured article of the invention as a function of elongation, up to its breaking.

The test results are presented in FIG. 11: the curve in the graph represents the variation of the electrical resistance of trace 91 (R, measured in Ω), on the ordinate, and the percentage elongation (ε %), on the abscissa. The sample has an initial resistance, $R_0$ (at zero strain), equal to 29Ω; the resistance increases progressively with strain, reaching a maximum value of 1057Ω at an elongation of 97%.

The maintenance of conductivity up to an elongation of 97% is already in itself a notable achievement compared to the possibilities offered by most of the systems of the prior art. In addition, it must be pointed out that, at this value of elongation, the manufactured article of this example loses its conductivity due to a rupture of the polymer film and not to an intrinsic electrical failure (due to a break of the nanocomposite trace).

Figure 12:
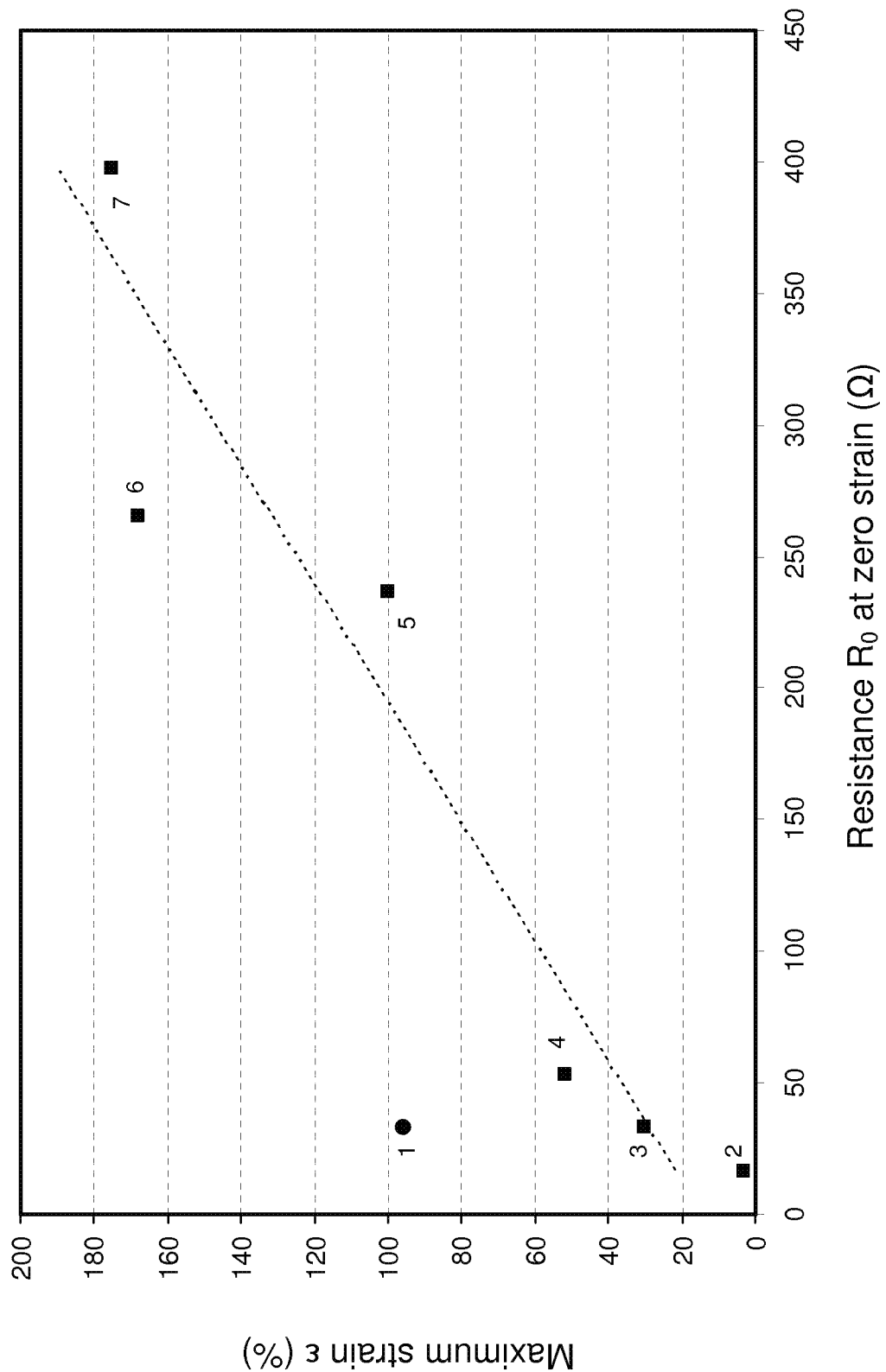
FIG. 12 shows a comparison of data of maximum strain before electrical breaking as a function of resistance at zero strain for an article of the invention and for samples prepared according to the prior art.

For comparison purposes, the result obtained with the sample of the invention is reported in the graph in FIG. 12, along with results obtained similar specimens produced according to prior art techniques. In the figure, are reported the value of maximum strain before electrical breakdown of a given sample (ordinate axis) as a function of resistance at zero strain, $R_0$, of the same sample. In this graph, the values found for the sample of the invention are represented by point 1 (full circle). The prior art data are those presented in FIG. 6 of the article "Metal Ion Implantation for the fabrication of stretchable electrodes on elastomers" by S. Rosset et al., cited before; these data represent the values for a sample prepared by sputtering (point 2) and for five samples prepared according to the technique of said article (points 3 to 7). As will be evident to those skilled in the art, it is important to compare specimens with similar $R_0$ values since, first of all, $R_0$ is directly related to the amount of the deposit of the metallic material in a given specimen (higher $R_0$ values are indicative of conductive traces of lower cross-section and in particular lower thickness); and, because the amount of the metallic deposit influences cracks formation in the conductive layers.

As can be seen from the graph in FIG. 12, the manufactured article produced according to the invention has a much higher resistance to strain compared to samples of similar initial resistance (samples represented by point 2, produced by sputtering, and points 3 and 4, produced by ion implantation); a resistance to strain comparable to that of the sample of the invention is only obtained by a prior art sample (produced by ion implantation) having $R_0$=237 0, that is, a sample having initial resistance much higher (nearly an order of magnitude) than the initial resistance of the manufactured article of the present invention, and thus having a much lower thickness of the conductive layer in comparison to the article of the present invention. The trend line reported in FIG. 12 has been obtained with the five samples obtained by ion implantation, and this too makes clear that the sample of the invention has a much better value of maximum strain at same $R_0$. From this comparison can thus be concluded that the method of the invention makes it possible to produce devices with a better combination of properties.

Example 7

This example relates to evaluation of the characteristics of biocompatibility of a manufactured article of the invention.

The procedure of example 1 is repeated, with the sole difference that the PDMS polymer film is deposited on a microscope coverslip with a diameter of 13 mm, instead of on a silicon substrate. A stencil mask is used so that it masks half of the surface of the polymer film, and the film is exposed to the gold nanocluster beam by rastering (as described in example 1) for a time sufficient (60 minutes) to obtain a deposited equivalent thickness of approx. 35 nm (measured, as previously described, with a profilometer on a "blank" silicon sample). This dose of nanoclusters implanted in the PDMS polymer film is sufficient to permit emergence of a proportion of said gold nanoclusters on the surface of the polymer. In contrast to example 1, at the end of the implantation process, peeling of the film is not carried out. The film thus functionalized, together with the coverslip, is first sterilized by immersion in a 70% ethanol solution and is then immersed in a solution containing cells of the neuronal type of the PC12 line grown by the standard procedures used by a person skilled in the art. The cells in the solution are suspended in RPMI 1640 buffer solution (Sigma-Aldrich), to which 10% of thermally inactivated horse serum (HS) and 5% of fetal bovine serum (FBS) have been added. The concentration of cells in the solution is such that there is a concentration of 2000 cells per square centimetre on the film. The culture is incubated for 24 hours at 37° C. in a controlled atmosphere, composed of 95% air and 5% carbon dioxide ($CO_2$). At the end of the procedure the film is withdrawn from the solution, washed with PBS to remove the non-adherent cells, treated with calcein AM at a concentration of 2.5 µmol/l for one hour for identifying the neuronal cells that are still alive, and put on the specimen holder of a fluorescence microscope. As is known to those skilled in the art, the molecules of calcein AM penetrate into the cell membrane by diffusion and here, if the cell is alive, are degraded by the esterase enzymes produced by said cell.

The consequence of this degradation is that the modified molecules of calcein AM remain trapped inside the cell membrane and become highly fluorescent (emitting green light, at approx. 520 nm, if exposed to light with wavelength of approx. 490 nm). This method thus makes it possible to distinguish live cells from dead cells in a cell culture, since following exposure to calcein AM, the live cells emit a green fluorescence, in contrast to the dead cells.

For comparison purposes, a PC12 cells culture is grown on a standard TOPS (i.e. Tissue Culture PolyStyrene) multiwell culture plate, following the same procedure described above.

Figure 13:
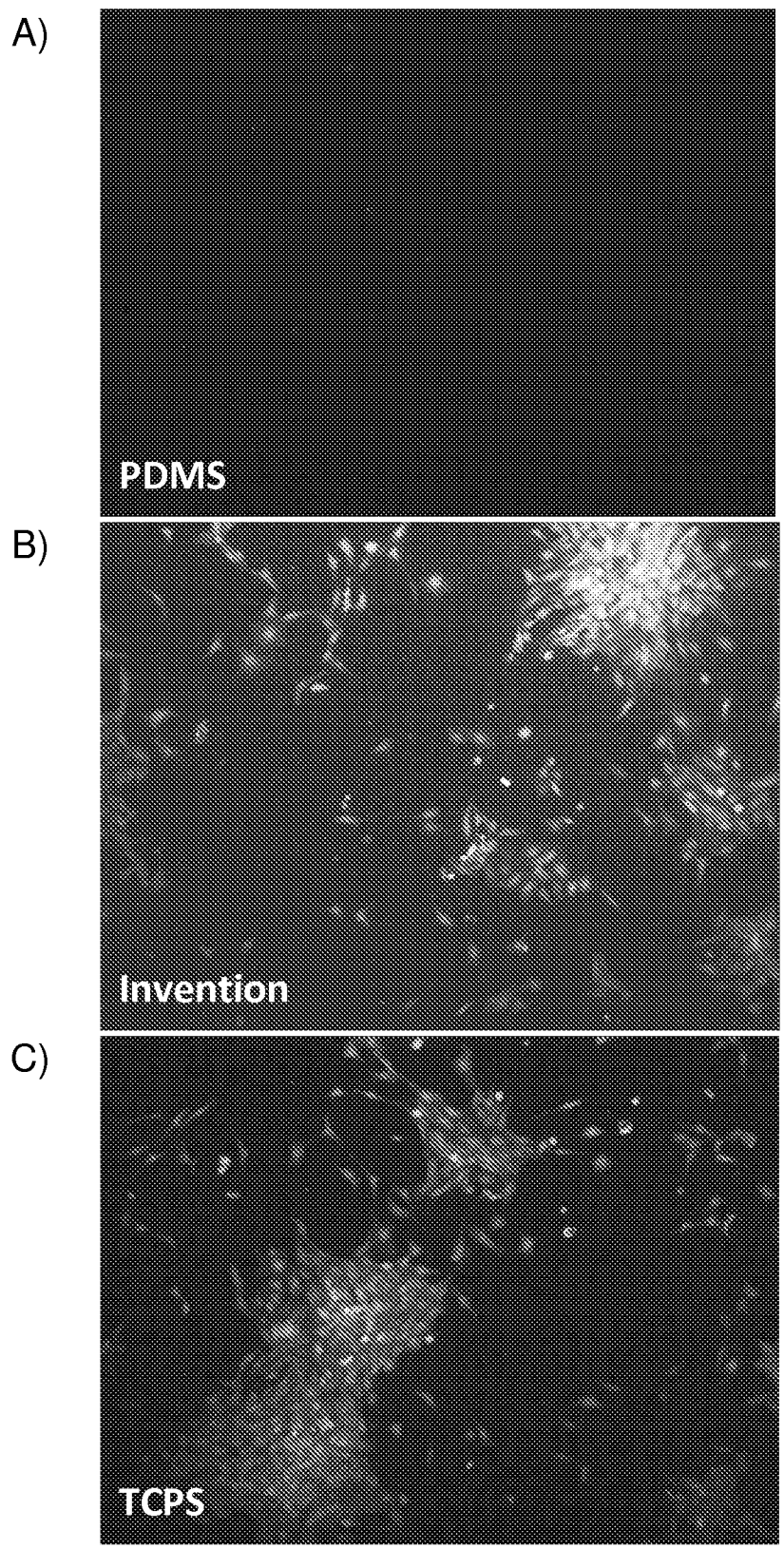
FIGS. 13 and 14 show microphotographs of samples of the invention and of comparative samples, on which cell cultures have been grown.

The sample of the invention and the TOPS-based sample are then observed by light microscopy (at 10× magnification), taking photographs that are reproduced in FIG. 13; in particular, FIG. 13 (A) shows the part of the PDMS film in which nanoclusters implantation did not take place, FIG. 13 (B) shows the part of the PDMS film in which the gold nanocomposite was formed, and FIG. 13 (C) shows the photograph of the cell culture obtained with TCPS.

The photograph clearly shows that in the part of the elastomer film in which the nanocomposite is present, there is presence of fluorescent (and therefore live) neuronal cells, far greater than in the non-functionalized elastomer. Moreover, the elongated shape of the fluorescent neuronal cells present on the functionalized PDMS film demonstrates, in addition to the vitality of said cells, also their excellent adherence to the nanocomposite. Furthermore, the results obtained in the part of the elastomer film in which the nanocomposite is present are comparable with the ones obtained with a standard TCPS culture plate.

On the basis of these two observations (increased presence of live cells and high level of adherence to the nanocomposite) it is thus demonstrated that the nanocomposites according to the invention have better bioactivity compared with an elastomer, PDMS, that is already highly biocompatible and is used for devices that are implantable in the human body.

Example 8

Figure 14:
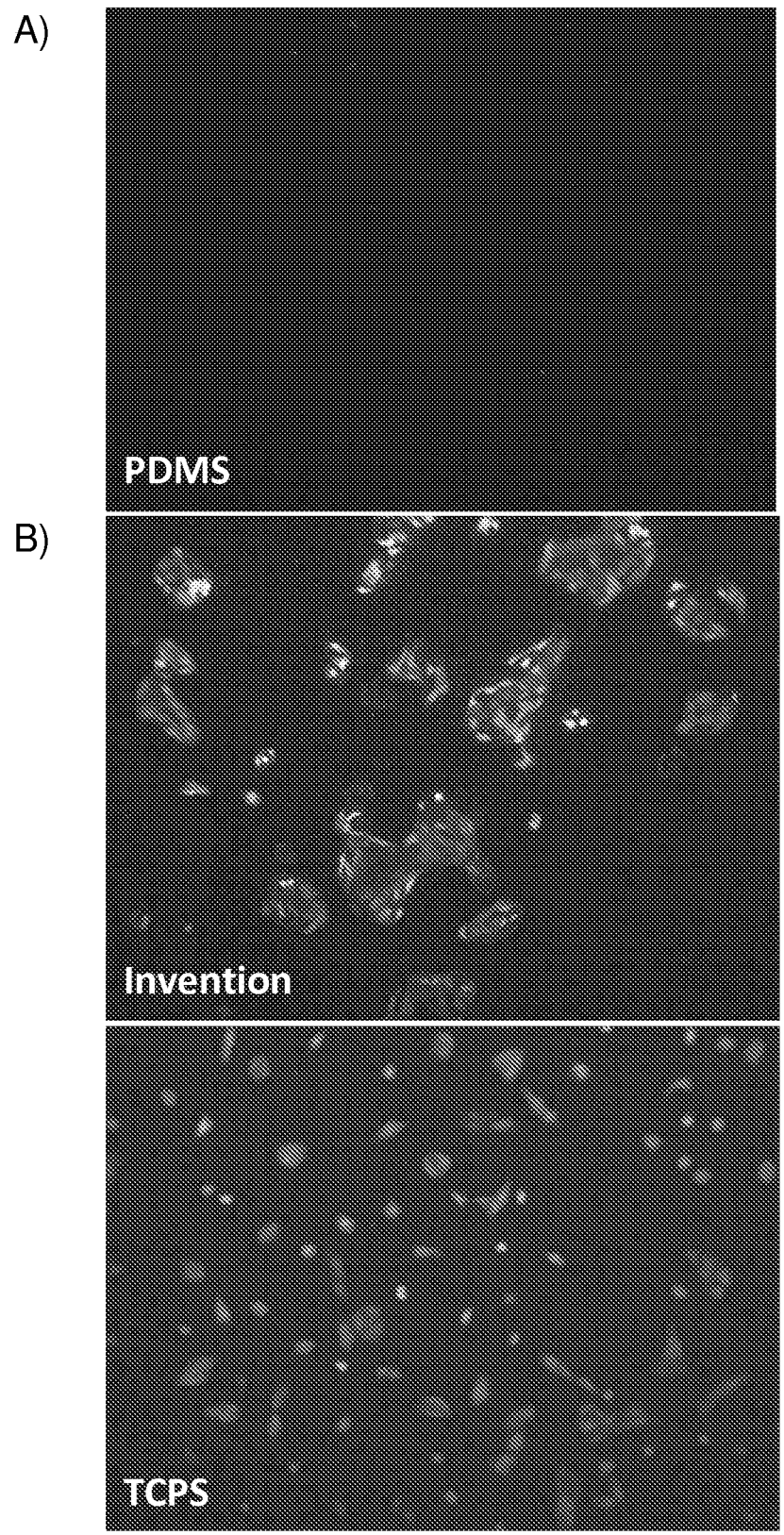

The procedure of Example 7 is repeated, using in this case Madin-Darby Canine Kidney (MDCK) epithelial cell line instead of PC12 cell line. The results of optical microscopy (at 10× magnification) are reproduced in FIG. 14; FIG. 14 (A) shows the part of the PDMS film in which nanoclusters implantation did not take place, FIG. 14 (B) shows the part of the PDMS film in which the gold nanocomposite was formed, and FIG. 14 (C) shows the photograph of the results obtained with TOPS.

These photographs clearly show that in the part of the elastomer film in which the nanocomposite is present, there is presence of fluorescent (and therefore live) epithelial cells, far greater than in the non-functionalized elastomer. In this case, cell adhesion on the part of elastomer functionalized according to the invention appears quite better than that observed on TOPS.

On the basis of these observations (increased presence of live cells and high level of adherence to the nanocomposite) it is thus demonstrated that the nanocomposites according to the invention have better bioactivity compared with an elastomer, PDMS, that is already highly biocompatible and is used for devices that are implantable in the human body.

Example 9

This example relates to the analysis through Atomic Force Microscopy technique of the surface morphological characteristics of a manufactured article of the invention.

Figure 15:
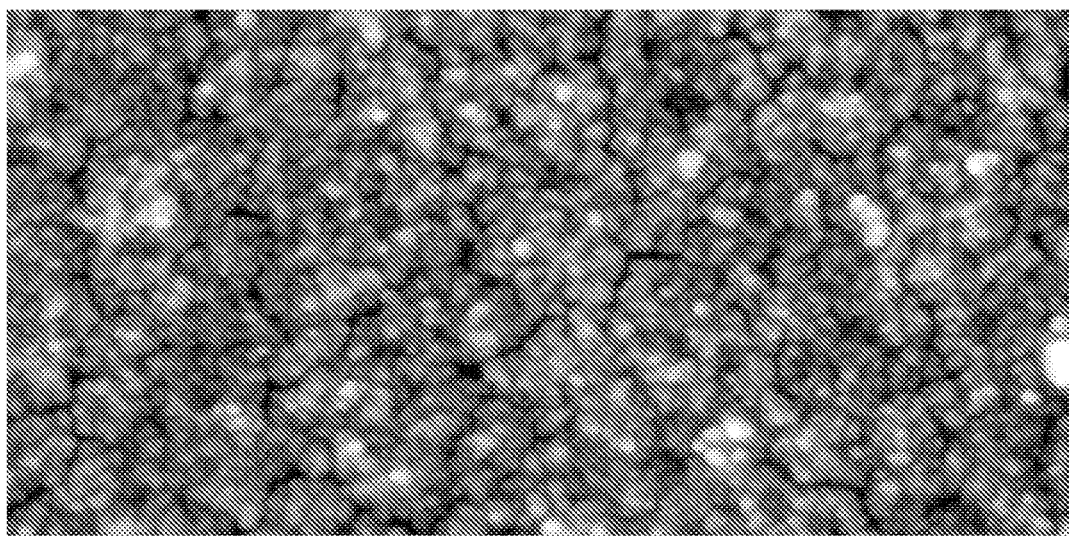
FIG. 15 shows atomic force microscopy images of two samples of the invention, showing their surface morphology.
Figure 15:
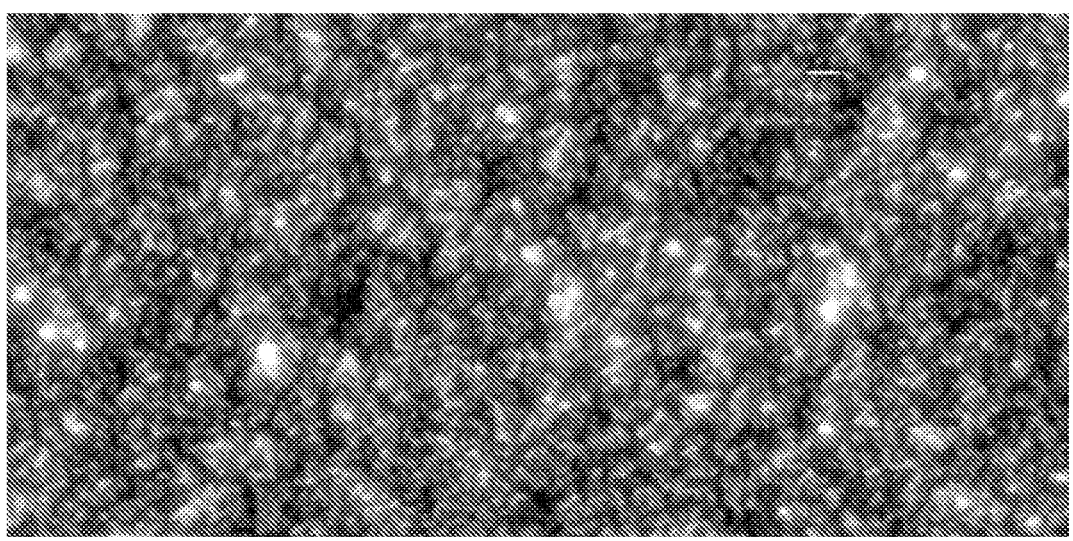

A manufactured article is produced by exactly repeating the procedure of example 7, with the sole difference that the film is exposed to the gold nanocluster beam by rastering (as described in example 1) for a time sufficient (40 minutes) to obtain a deposited equivalent thickness of approx. 20 nm. At the end of the implantation process, the thus functionalized film is analyzed (in the selected zones, where the nanocomposite trace is present) with an Atomic Force Microscope (AFM), following standard procedures and protocols for the analyses of the surface morphology with AFM technique. FIG. 15 (A) shows the resulting AFM image (image size: 1 µm×2 µm). As can be seen by the image in FIG. 15 (A), the nanocomposite trace of the manufactured article of the present invention has a characteristic surface morphology. In particular, the surface roughness of the nanocomposite trace of the film obtained in this example has a value of approx. 3.7 nm.

A second manufactured article is then produced following the same procedure described above, but adopting an exposure time of 10 minutes, leading to an equivalent thickness of approx 5 nm. Subsequently, the functionalized film is analysed with AFM as in the previous case. The AFM image (image size: 1 µm×2 µm) is reported in FIG. 15 (B). Also in this case, it can be clearly seen the characteristic surface morphology of the nanocomposite trace produced with the method of the present invention. In this case, AFM measures indicate that the surface roughness of the nanocomposite trace is approx. 2.98 nm.

What is claimed:

1. A biocompatible elastomeric device, said device comprising:
   an elastomeric support, said elastomeric support having a surface layer portion and a lower portion, and
   one or more functionalized and geometrically defined nanocomposite regions within the surface layer portion of the elastomeric support, said one or more nanocomposite regions comprising neutral nanoclusters of metal, metal oxide, or other metal compound, said neutral nanoclusters having a dimension of between 1 nm to 10 nm and a density within the surface layer portion of greater than about $5 \times 10^{-3}$ nanoclusters/nm$^3$,
   wherein one or more neutral nanoclusters of the neutral nanoclusters are implanted in the surface layer portion of the elastomeric support, and
   wherein the one or more neutral nanoclusters that are implanted are not exposed outside of the surface layer portion.

2. The elastomeric device according to claim 1, wherein the thickness of the nanocomposite region is between 5 nm and 10 μm, and the thickness of the elastomeric support is between 500 nm and 1 mm.

3. The elastomeric device according to claim 1, wherein the thickness of the nanocomposite region is between 50 nm and 1 μm, and the thickness of the elastomeric support is between 500 nm and 1 mm.

4. The elastomeric device according to claim 1, wherein when said nanocomposite region of said article is subject to 40% elongation strain, its electrical resistance increases by a value less than 250% relative to the resistance of said nanocomposite region at rest.

5. The elastomeric device according to claim 1, wherein the elastomeric support comprises an elastomeric material selected from polysiloxanes, polyurethane elastomers, elastomeric fluoropolymers, elastomers based on polyolefins, polybutadiene (BR), styrene-butadiene rubbers (SBR), ethylene-propylene rubbers (EPR), ethylene-propylene-diene rubbers (EPDM), nitrile rubbers (NBR), acrylic rubbers (ACM), and those based on isobutylene and isoprene (IIR).

6. The elastomeric device according to claim 1 further comprising:
   a polymeric matrix that encapsulates the elastomeric support.

7. The elastomeric device according to claim 6, wherein said polymer matrix comprises openings for forming electrodes in said nanocomposite regions, openings for connecting electrical conductors to said nanocomposite regions, or openings for constituting sites of cellular growth.

8. The elastomeric device according to claim 1, wherein at least two neutral nanoclusters contact one another.

* * * * *